(12) United States Patent
Li et al.

(10) Patent No.: US 12,401,216 B2
(45) Date of Patent: Aug. 26, 2025

(54) BATTERY CHARGING CIRCUIT, BATTERY PACK AND BATTERY PACK CHARGING SYSTEM

(71) Applicant: Globe (Jiangsu) Co., Ltd., Changzhou (CN)

(72) Inventors: Baoan Li, Changzhou (CN); Xian Zhuang, Changzhou (CN); Chuanjun Liu, Changzhou (CN); Ming Luo, Changzhou (CN)

(73) Assignee: Globe (Jiangsu) Co., Ltd., Changzhou (CN)

( * ) Notice: Subject to any disclaimer, the term of this patent is extended or adjusted under 35 U.S.C. 154(b) by 829 days.

(21) Appl. No.: 17/673,729

(22) Filed: Feb. 16, 2022

(65) Prior Publication Data

US 2022/0278542 A1   Sep. 1, 2022

(30) Foreign Application Priority Data

Feb. 26, 2021   (CN) .......................... 202110224211.3

(51) Int. Cl.
*H02J 7/00* (2006.01)
*H10D 84/85* (2025.01)
*H10D 89/60* (2025.01)

(52) U.S. Cl.
CPC ....... *H02J 7/007182* (2020.01); *H10D 84/85* (2025.01); *H10D 89/611* (2025.01); *H10D 89/811* (2025.01)

(58) Field of Classification Search
CPC . H02J 7/007182; H10D 84/85; H10D 89/611; H10D 89/811

USPC .................................................. 320/112, 128
See application file for complete search history.

(56) References Cited

U.S. PATENT DOCUMENTS

| | | | |
|---|---|---|---|
| 10,658,856 B1* | 5/2020 | Baruzzi | H02J 7/00714 |
| 2008/0150488 A1* | 6/2008 | Lu | H02J 7/0031 320/136 |
| 2009/0102432 A1* | 4/2009 | Hsieh | H02J 7/0031 320/163 |
| 2009/0197156 A1 | 8/2009 | Goto | |
| 2012/0112686 A1 | 5/2012 | Zhang | |
| 2020/0381917 A1 | 12/2020 | Takeda | |

FOREIGN PATENT DOCUMENTS

CN    110429833 A    11/2019
EP     1533882 A2    5/2005

* cited by examiner

*Primary Examiner* — Richard V Muralidar

(57) ABSTRACT

The disclosure provides a battery charging circuit, a battery pack and a battery pack charging system. The battery charging circuit includes a first control switch, a switch control unit and a power supply unit. The first control switch is arranged between the charging positive terminal and the positive electrode of the battery pack, or between the charging negative terminal and the negative electrode of the battery pack, and it is an NMOS transistor with a body diode. The switch control unit is connected to the gate, source, and drain of the first control switch and controls the on-off of the first control switch by sampling a voltage between the source and the drain of the first control switch. The output end of the power supply unit is connected to the power source end of the switch control unit to supply power to the switch control unit.

13 Claims, 6 Drawing Sheets

BATTERY CHARGING CIRCUIT, BATTERY PACK AND BATTERY PACK CHARGING SYSTEM

CROSS REFERENCE TO RELATED APPLICATION

The present application is based on, and claims the priority from, Chinese application number CN 202110224211.3, filed on Feb. 26, 2021, the disclosure of which is hereby incorporated by reference herein in its entirety.

TECHNICAL FIELD

The disclosure relates to the technical field of battery pack charging, in particular to a battery charging circuit, a battery pack and a battery pack charging system.

BACKGROUND

At present, in the battery pack industry, battery pack charging is generally controlled by the MCU controlling the on-off of one or more PMOS transistors on the charging circuit. In the low-current charging mode, this solution has obvious advantages. It can prevent charging from overvoltage and ensure that there is no voltage when the charging port is not used, which is safe and reliable. However, with the continuous innovation of battery technology and the increasing capacity of battery packs, high-current fast charging technology has become more and more widely used. Due to process limitations, the conventional solution of PMOS transistors has a relatively large internal resistance and a high temperature rise in the fast charging mode, which requires additional cooling devices to cool down and results in a large volume and high cost.

SUMMARY

The disclosure provides a battery charging circuit, a battery pack and a battery pack charging system. It is used to solve technical problems of a need of additional heat dissipation devices to cool when using conventional PMOS transistors to control a charging of a battery pack, which results in a large volume and high cost.

The disclosure provides a battery charging circuit. The battery pack includes: a first control switch, a switch control unit, and a power supply unit. The first control switch is an NMOS transistor Q11 with a body diode, a source of the first control switch is connected with a charging positive terminal and a drain of the first control switch is connected with a positive electrode of a battery unit. The switch control unit is connected with a gate, the source, and the drain of the first control switch and controls on-off of the first control switch by sampling a voltage between the source and the drain of the first control switch. An output end of the power supply unit is connected with a power source end of the switch control unit and configured to supply power to the switch control unit.

In an alternative embodiment, the battery charging circuit further includes: a second control switch, a controller, and a voltage regulator. The second control switch is an NMOS transistor Q12 with a body diode, a drain of the second control switch is connected with the drain of the first control switch and a source of the second control switch is connected with the positive electrode of the battery unit. The controller is configured to control on-off of the second control switch. The power supply end of the controller is connected with the positive electrode of the battery unit through the voltage regulator.

In an alternative embodiment, the voltage regulator includes a low-dropout linear regulator.

In an alternative embodiment, the battery charging circuit further includes a PMOS transistor Q13, a resistor R31 and a Zener diode ZD31. A source of the PMOS transistor Q13 is connected with an output end of the power supply unit, a drain of the PMOS transistor Q13 is connected with one end of the resistor R31, the other end of the resistor R31 is respectively connected with a gate of the NMOS transistor Q12 and a cathode of the Zener diode ZD31, an anode of the Zener diode ZD31 is respectively connected with a source of the NMOS transistor Q12 and the positive electrode of the battery unit, and a gate of the PMOS transistor Q13 is connected with the controller.

In an alternative embodiment, the battery charging circuit further includes a voltage collection unit connected to the controller, and the voltage collection unit is configured to collect a battery voltage of the battery unit and transmits the battery voltage to the controller.

In an alternative embodiment, the battery charging circuit further includes a temperature collection unit connected to the controller and the temperature collection unit is configured to collect a battery temperature of the battery unit and transmits the battery temperature to the controller.

In an alternative embodiment, the battery charging circuit further includes a communication terminal and a communication module, and the communication terminal is connected to the controller through the communication module.

In an alternative embodiment, the temperature collection unit includes a temperature sensor.

In an alternative embodiment, a power source of the power supply unit is provided by a voltage at the charging terminal.

In an alternative embodiment, the power supply unit includes a boost circuit chip U1, a resistor R11, a resistor R12, a resistor R13, a diode D11, a diode D12, an inductor L11, a capacitor C11, and a capacitor C12. An anode of the diode D11 is respectively connected with the charging positive terminal and a source of the NMOS transistor Q11, and a cathode of the diode D11 is connected with a charging negative terminal through the capacitor C11. At the same time, the cathode of the diode D11 is respectively connected with a first end of the boost circuit chip U1 and one end of the resistor R11, the other end of the resistor R11 is respectively connected with one end of the inductor L11 and a second end of the boost circuit chip U1, the other end of the inductor L11 is respectively connected with a third end of the boost circuit chip U1 and an anode of the diode D12, and a cathode of the diode D12 is further connected with the charging negative terminal through the capacitor C12. At the same time, the cathode of the diode D12 is further respectively connected with a power source end of the switch control unit and one end of the resistor R13, the other end of the resistor R13 is connected with a fourth end of the boost circuit chip U1. Simultaneously, the other end of the resistor R13 is connected with the charging negative terminal through the resistor R12 and a fifth end of the boost circuit chip U1 is connected with the charging negative terminal.

In an alternative embodiment, the model of the boost circuit chip U1 is MC34063.

In an alternative embodiment, the power supply unit includes a resistor R14, a resistor R15, an NPN triode Q14, a capacitor C13, a diode D13, and a Zener diode ZD11. A base of the NPN triode is respectively connected with a cathode of the Zener diode ZD11 and one end of the resistor R15, an anode of the Zener diode ZD11 is respectively connected with the charging positive terminal and a source of the NMOS transistor Q11, the other end of the resistor R15 is respectively connected with one end of the resistor R14 and a cathode of the diode D13, an anode of the diode D13 is connected with the charging negative terminal, the other end of the resistor R14 is connected with a collector of the NPN triode Q14, and an emitter of the NPN triode Q14 is connected with the charging positive terminal and the source of the NMOS transistor Q11 through a capacitor C13. At the same time, the emitter of the NPN triode Q14 is connected with the power source end of the switch control unit.

In an alternative embodiment, the power source of the power supply unit is provided by the battery unit.

In an alternative embodiment, the power supply unit includes a boost circuit chip U1, a resistor R11, a resistor R12, a resistor R13, a diode D11, a diode D12, an inductor L11, a capacitor C11, and a capacitor C12. An anode of the diode D11 is connected with the charging positive terminal of the NMOS transistor Q12, and a cathode of the diode D11 is connected with the charging negative terminal through the capacitor C11. At the same time, the cathode of the diode D11 is respectively connected with a first end of the boost circuit chip U1 and one end of the resistor R11, the other end of the resistor R11 is respectively connected with one end of the inductor L11 and a second end of the boost circuit chip U1, the other end of the inductor L11 is respectively connected with a third end of the boost circuit chip U1 and an anode of the diode D12, and a cathode of the diode D12 is further connected with the charging negative terminal through the capacitor C12. Simultaneously, the cathode of the diode D12 is respectively connected with the power source end of the switch control unit and one end of the resistor R13, the other end of the resistor R13 is connected with a fourth end of the boost circuit chip U1. At the same time, the other end of the resistor R13 is connected with the charging negative terminal through the resistor R12, and a fifth terminal of the boost circuit chip U1 is connected with the charging negative terminal.

In an alternative embodiment, the model of the boost circuit chip U1 is MC34063.

In an alternative embodiment, the switch control unit includes an intelligent synchronous rectification control chip U2, a resistor R21, a resistor R22, a resistor R23, a resistor R24, and a Zener diode ZD21. A first end of the intelligent synchronous rectification control chip U2 is respectively connected with a source of the NMOS transistor Q11 and the charging positive terminal, simultaneously a first end of the intelligent synchronous rectification control chip U2 is connected with one end of the resistor R21, the other end of the resistor R21 is connected with a second end of the intelligent synchronous rectification control chip U2, a third end of the intelligent synchronous rectification control chip U2 is respectively connected with the source of the NMOS transistor Q11 and the charging positive terminal, a fourth end of the intelligent synchronous rectification control chip U2 is connected with a gate of the NMOS transistor Q11 through the resistor R24, a fifth end of the intelligent synchronous rectification control chip U2 is connected with a drain of the NMOS transistor Q11 through the resistor R23, a sixth end of the intelligent synchronous rectification control chip U2 is respectively connected with one end of the resistor R22 and a cathode of the Zener diode ZD21, an anode of the Zener diode ZD21 is connected with the charging negative terminal, and the other end of the resistor R22 is respectively connected with a seventh end of the intelligent synchronous rectification control chip U2 and an output end of the power supply unit.

In an alternative embodiment, the model of the intelligent synchronous rectification control chip U2 is MP6905.

The disclosure further provides a battery charging circuit. The battery charging circuit includes: a first control switch, a switch control unit, and a power supply unit. The source of the first control switch is connected with a cathode of a battery unit, a drain of the first control switch is connected with a charging negative terminal, and the first control switch is an NMOS transistor with a body diode. The switch control unit is respectively connected with a gate, the source, and the drain of the first control switch and the switch control unit controls on-off of the first control switch by sampling a voltage between the source and the drain of the first control switch. An output end of the power supply unit is connected with a power source end of the switch control unit and configured to supply power to the switch control unit.

In an alternative embodiment, the battery charging circuit further provides: a second control switch, a controller, and a voltage regulator. The second control switch is an NMOS transistor with a body diode, a source of the second control switch is connected with the source of the first control switch and a drain of the second control switch is connected with a negative electrode of the battery unit. The controller is connected with a gate of the second control switch and configured to control on-off of the second control switch. A power supply end of the controller is connected with a positive electrode of the battery unit through the voltage regulator.

In an alternative embodiment, the voltage regulator includes a low-dropout linear regulator.

In an alternative embodiment, the battery charging circuit further includes a voltage collection unit connected to the controller and the voltage collection unit is configured to collect a battery voltage of the battery unit and transmits the battery voltage to the controller.

In an alternative embodiment, the battery charging circuit further includes a temperature collection unit connected with the controller and the temperature collection unit is configured to collect a battery temperature of the battery unit and transmits the battery temperature to the controller.

In an alternative embodiment, the battery charging circuit further includes a communication terminal and a communication module, and the communication terminal is connected with the controller through the communication module.

In an alternative embodiment, the temperature collection unit includes a temperature sensor.

In an alternative embodiment, a power source of the power supply unit is provided by a voltage at the charging terminal.

In an alternative embodiment, the power supply unit includes a resistor R14, a resistor R15, an NPN triode Q14, a capacitor C13, a diode D13, and a Zener diode ZD11. A base of the NPN triode is respectively connected with a cathode of the Zener diode ZD11 and one end of the resistor R15. An anode of the Zener diode ZD11 is respectively connected with the charging negative terminal and a drain of the NMOS transistor Q11. The other end of the resistor R15 is respectively connected with one end of the resistor R14 and a cathode of the diode D13. An anode of the diode D13 is connected with the charging positive terminal and the positive electrode of the battery unit. The other end of the resistor R14 is connected with a collector of the NPN triode Q14. An emitter of the NPN triode Q14 is connected with the charging negative terminal and the drain of the NMOS transistor Q11 through a capacitor C13. At the same time, the emitter of the NPN triode Q14 is connected with the power source end of the switch control unit.

In an alternative embodiment, the power source of the power supply unit is provided by the battery unit.

In an alternative embodiment, the power supply unit includes a resistor R14, a resistor R15, an NPN triode Q14, a capacitor C13, a diode D13, and a Zener diode ZD11. A base of the NPN triode Q14 is respectively connected with a cathode of the Zener diode ZD11 and one end of the resistor R15, an anode of the Zener diode ZD11 is respectively connected with the negative electrode of the battery unit and a source of the NMOS transistor Q11, the other end of the resistor R15 is respectively connected with one end of the resistor R14 and a cathode of the diode D13, an anode of the diode D13 is respectively connected with the positive electrode of the battery unit and the charging positive terminal, the other end of the resistor R14 is connected with a collector of the NPN triode Q14, an emitter of the NPN triode Q14 is respectively connected with the negative electrode of the battery unit and the source of the NMOS transistor Q11 through the capacitor C13, and at the same time the emitter of the NPN triode Q14 is connected with the power source end of the switch control unit.

In an alternative embodiment, the switch control unit includes an intelligent synchronous rectification control chip U2, a resistor R21, a resistor R22, a resistor R23, a resistor R24, and a Zener diode ZD21. A first end of the intelligent synchronous rectification control chip U2 is respectively connected with a source of the NMOS transistor Q11 and the negative electrode of the battery unit, simultaneously the first end of the intelligent synchronous rectification control chip U2 is connected with one end of the resistor R21, the other end of the resistor R21 is connected with a second end of the intelligent synchronous rectification control chip U2, a third end of the intelligent synchronous rectification control chip U2 is respectively connected with the source of the NMOS transistor Q11 and the negative electrode of the battery unit, a fourth end of the intelligent synchronous rectification control chip U2 is connected with the gate of the NMOS transistor Q11 through the resistor R24, a fifth end of the intelligent synchronous rectification control chip U2 is connected with the drain of the NMOS transistor Q11 through the resistor R23, a sixth end of the intelligent synchronous rectification control chip U2 is respectively connected with one end of the resistor R22 and a cathode of the Zener diode ZD21, an anode of the Zener diode ZD21 is connected with the charging negative terminal, and the other end of the resistor R22 is respectively connected with a seventh end of the intelligent synchronous rectification control chip U2 and an output end of the power supply unit.

In an alternative embodiment, the model of the intelligent synchronous rectification control chip U2 is MP6905.

The disclosure further provides a battery pack. The battery pack includes: a housing, a battery unit, and the battery charging circuit. The housing is provided with a housing cavity. The battery unit is mounted in the housing cavity. The battery charging circuit is mounted in the housing cavity and connected with the battery unit.

The disclosure further provides a battery pack charging system, the battery pack charging system includes the battery pack and a charger. The charger is matched with the battery pack. The charger includes an alternating current charger, a direct current charger, or an alternating current and direct current charger.

The battery charging circuit, the battery pack and the battery pack charging system of the embodiments control on-off of the charging circuit through a high-side drive or a low-side drive NMOS transistor. Compared with the conventional PMOS transistor control, it has characteristics of low cost, strong over-current capability, low heat generation, high charging efficiency and prevention of discharge from the charging port.

With the battery charging circuit, the battery pack and the battery pack charging system of the embodiments, since an on-channel resistance of the NMOS transistor is smaller than that of the PMOS transistor, the NMOS transistor has low power consumption and low heat generation when it is turned on, and the cooling device may not be provided.

The battery charging circuit, the battery pack and the battery pack charging system of the embodiments are applicable to direct current charging and alternating current charging.

With the battery charging circuit, the battery pack and the battery pack charging system of the embodiments, a switching response time of the NMOS transistor is as low as 200 ns.

DETAILED DESCRIPTION

The following describes the implementation of the disclosure through specific embodiments, and those skilled in the art can easily understand other advantages and effects of the disclosure from the content disclosed in this specification. The disclosure can also be implemented or applied through other different specific embodiments, and various details in this specification can also be modified or changed based on different viewpoints and applications without departing from the disclosure.

Please refer to FIG. 1 through FIG. 9, it should be noted that the figures provided in this embodiment only illustrate the basic idea of the disclosure in a schematic manner. The figures only show the components related to the disclosure instead of drawing according to the number, shape and size of the components during actual implementation. The type, number and proportion of each component during actual implementation can be changed at will, and the layout of its components may also be more complicated.

Figure 1:
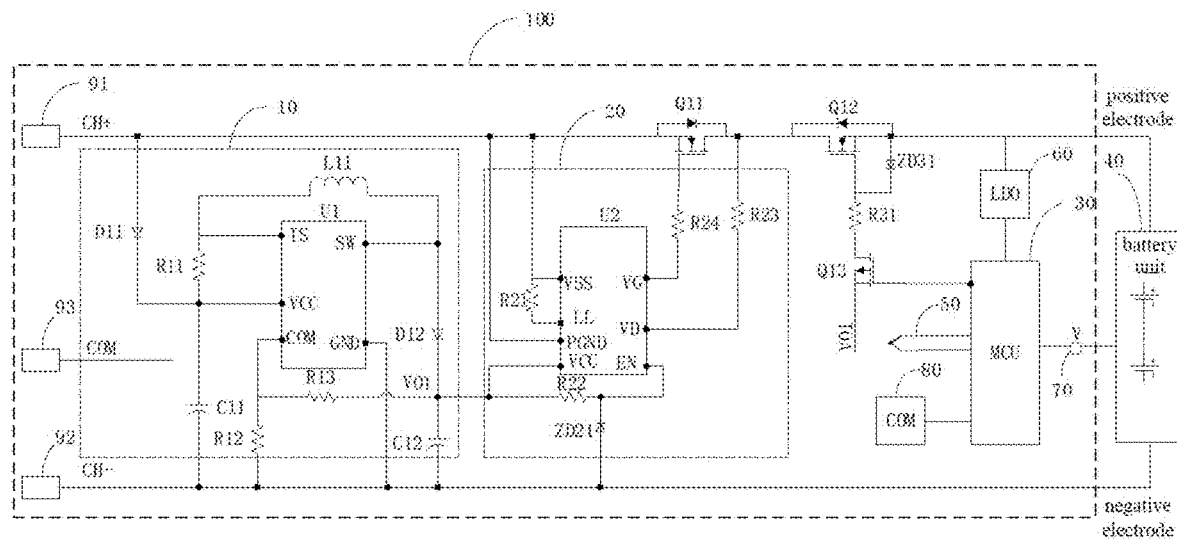
FIG. 1 shows a circuit view of a first embodiment of a battery charging circuit of the disclosure.
Figure 2:
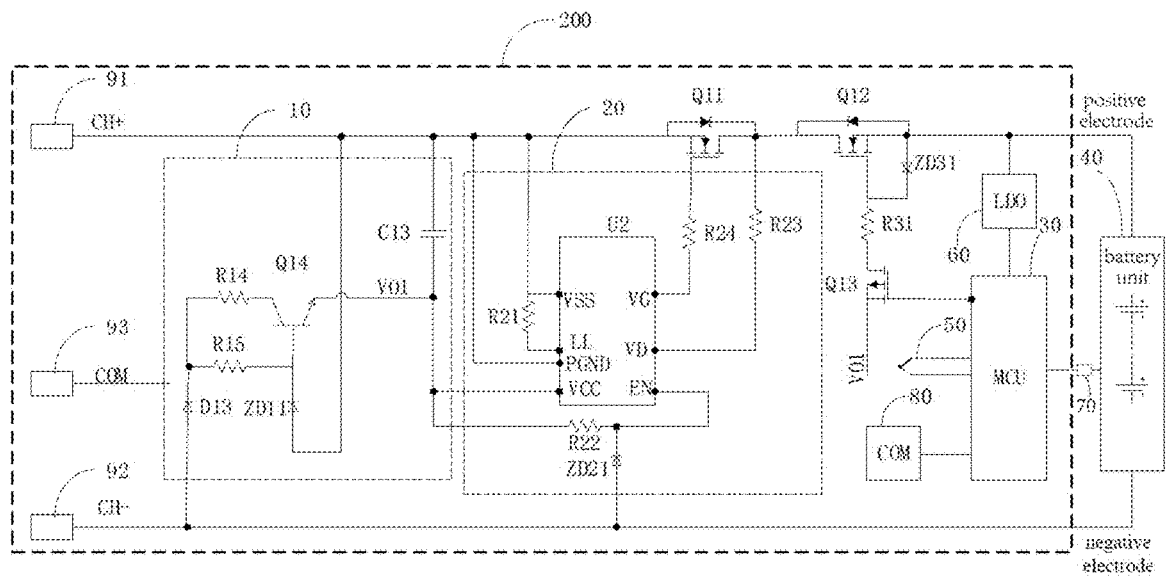
FIG. 2 shows a circuit view of a second embodiment of the battery charging circuit of the disclosure.
Figure 3:
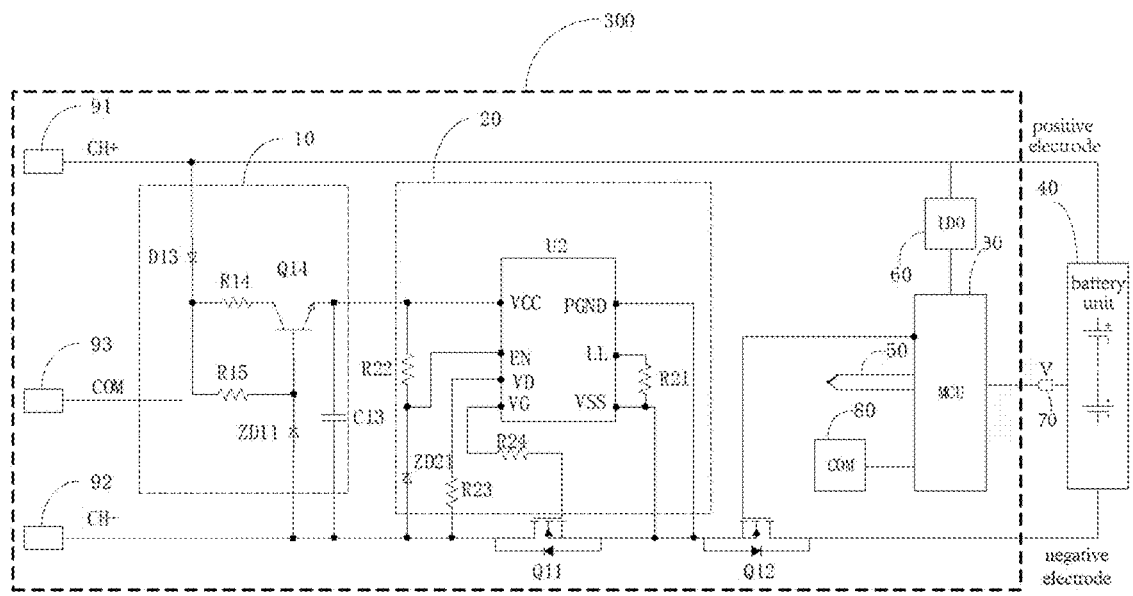
FIG. 3 shows a circuit view of a third or fourth embodiment of the battery charging circuit of the disclosure.
Figure 4:
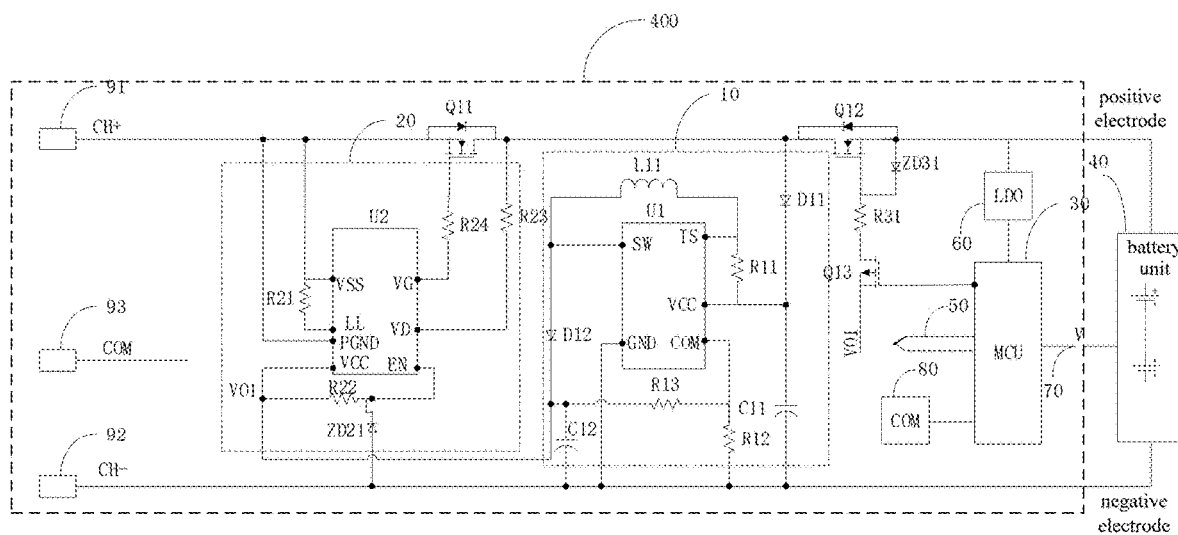
FIG. 4 shows a circuit view of a fifth or sixth embodiment of the battery charging circuit of the disclosure.
Figure 5:
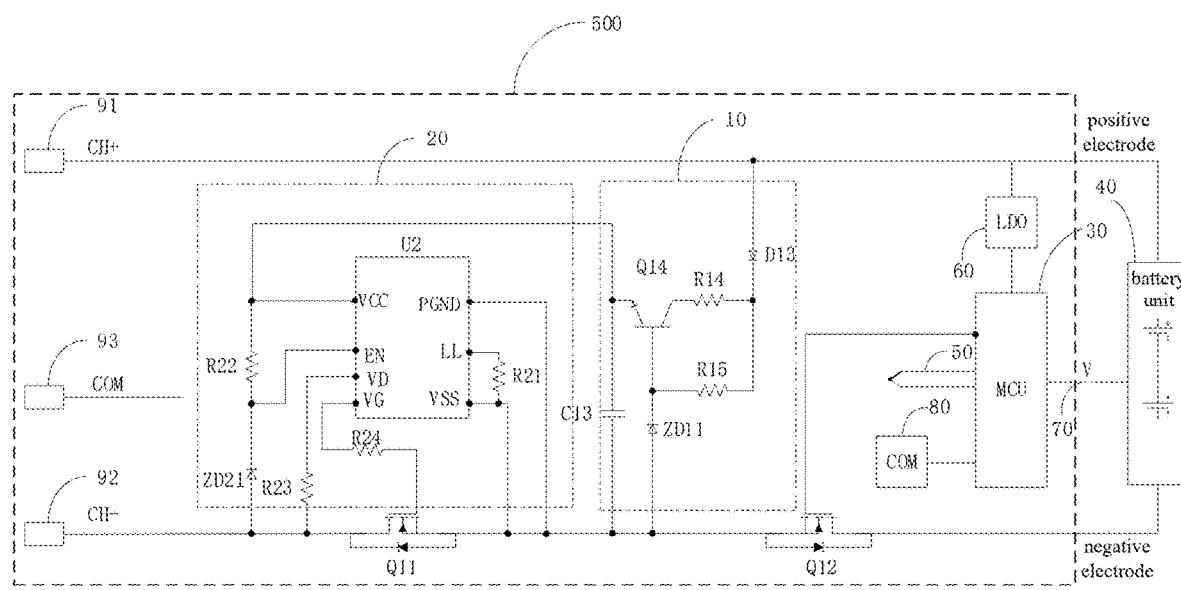
FIG. 5 shows a circuit view of a seventh or eighth embodiment of the battery charging circuit of the disclosure.

In order to solve the technical problem of a need to add an additional cooling device when using a battery pack with a PMOS transistor to charge and control, which results in large volume and high cost, please refer to FIG. 1 through FIG. 5, the disclosure provides a battery charging circuit. The battery charging circuit includes a charging terminal, an NMOA transistor Q11, a switch control unit 20 and a power supply unit 10. According to different connection positions of the NMOS transistor Q11, the NMOS transistor Q11 may be high-side driving as shown in FIG. 1, FIG. 2 and FIG. 4, or low-side driving as shown in FIG. 3 and FIG. 5. The NMOS transistor Q11 is an NMOS transistor with a body diode. The charging terminal is used to connect with a charger, the switch control unit 20 is used to sample a voltage between the source and the drain of the NMOS transistor Q11 to control on-off of the NMOS transistor Q11, and the power supply unit 10 is used to supply power to the switch control unit 20. A power source of the power supply unit 10 may be provided by a voltage at the charging terminal as shown in FIG. 1 through FIG. 3, which means that it is powered by the charger. It may also be directly provided by a battery unit 40 as shown in FIG. 4 and FIG. 5. The battery unit 40 may also be called a battery module, or a battery string, which includes several battery cells (also called cells). The disclosure controls on-off of the charging circuit through the NMOS transistor. Compared with conventional PMOS transistor control, it has characteristics of strong overcurrent capability, low heat generation, high charging efficiency and prevention of discharge from a charging port. It should be noted that the battery charging circuit of the disclosure may be integrated into the battery pack or into a corresponding charger.

Please refer to FIG. 1, FIG. 2 and FIG. 4, the NMOS transistor Q11 is a high-side driving NMOS transistor with a body diode, and the charging terminal includes a charging positive terminal 91 and a charging negative terminal 92. A source of the NMOS transistor Q11 is connected with the charging positive terminal 91, and a drain of the NMOS transistor Q11 is connected with a positive electrode of the battery unit 40. The switch control unit 20 is respectively connected with a gate, source, and drain of the NMOS transistor Q11, and the switch control unit 20 controls the on-off of the NMOS transistor Q11 by sampling a voltage between the source and the drain of the NMOS transistor Q11. An output end of the power supply unit 10 is connected with a power source end of the switch control unit 20 for supplying power to the switch control unit 20.

Please refer to FIG. 1, FIG. 2 and FIG. 4, the battery charging circuit further includes an NMOS transistor Q12, a controller 30, and a low-dropout linear regulator 60. A drain of the NMOS transistor Q12 is connected with the drain of the NMOS transistor Q11. A source of the NMOS transistor Q12 is connected with the positive electrode of the battery unit 40, wherein a second control switch 12 is a secondary protection of NMOS to prevent the charger from over charging. The NMOS transistor Q12 is, for example, a NMOS transistor with a body diode. The controller 30 is used to control on-off of the NMOS transistor Q12. A power supply end of the controller 30 is connected with the positive electrode of the battery unit 40 through the low-dropout linear regulator 60, and the low-dropout linear regulator 60 is used to supply power to the controller 30.

Please refer to FIG. 3 and FIG. 5, the NMOS transistor Q11 is a low-side drive NMOS transistor with a body diode, and the charging terminal includes a charging positive terminal 91 and a charging negative terminal 92. The source of the NMOS transistor Q11 is connected with a negative electrode of the battery unit 40, and the drain of the NMOS transistor Q11 is connected with the negative charging terminal 92. The switch control unit 20 is respectively connected with the gate, source, and drain of the NMOS transistor Q11. The switch control unit 20 controls the on-off of the NMOS transistor Q11 by sampling a voltage between the source and the drain of the NMOS transistor Q11. An output terminal of the power supply unit 10 is connected with a power source end of the switch control unit 20 for supplying power to the switch control unit 20. Please refer to FIG. 3 and FIG. 5, the battery charging circuit further includes an NMOS transistor Q12, a controller 30, and a low-dropout linear regulator 60. A source of the NMOS transistor Q12 is connected with the source of the NMOS transistor Q11, and a drain of the NMOS transistor Q12 is connected with the negative electrode of the battery unit 40. The controller 30 is used to control on-off of the NMOS transistor Q12. A power supply end of the controller 30 is connected with the positive electrode of the battery unit 40 through the low-dropout linear regulator 60, and the low-dropout linear regulator 60 is used to supply power to the controller 30.

Please refer to FIG. 1 through FIG. 5, the battery charging circuit further includes a voltage collection unit 70 and a temperature collection unit 50 connected with the controller 30. The voltage collection unit 70 is used to collect a battery voltage of the battery unit 40 and transmit it to the controller 30. The temperature collection unit 50 is used to collect a battery temperature of the battery unit 40 and transmit it to the controller 30. As an example, the temperature collection unit 50 includes, for example, a temperature sensor and a peripheral circuit. The temperature sensor may be, for example, a positive temperature coefficient sensor (abbreviated as a PTC sensor) or a negative temperature coefficient sensor (abbreviated as an NTC sensor).

Please refer to FIG. 1 through FIG. 5, the battery charging circuit further includes a communication terminal and a communication module 80. The communication terminal is connected with the controller 30 through the communication module 80, and the communication module 80 provides information interaction for the battery unit 40 and the charger.

According to a power supply mode of the power supply unit 10 (powered by the battery unit 40 as shown in FIG. 4 and FIG. 5 and powered by the voltage at the charging terminal as shown in FIG. 1 through FIG. 3), a driving mode of a first control unit (the high-side driving shown in FIG. 1, FIG. 2 and FIG. 4 and the low-side driving shown in FIG. 3 and FIG. 5) and charging types (alternating current and direct current), the battery charging circuit has eight different control modes, which respectively correspond to following first embodiment to eighth embodiment.

Figure 6:
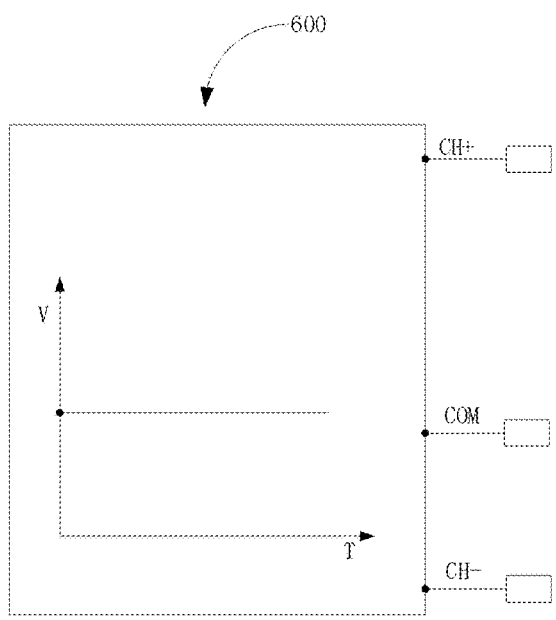
FIG. 6 shows a schematic view of a direct current charger of an embodiment of the disclosure.
Figure 7:
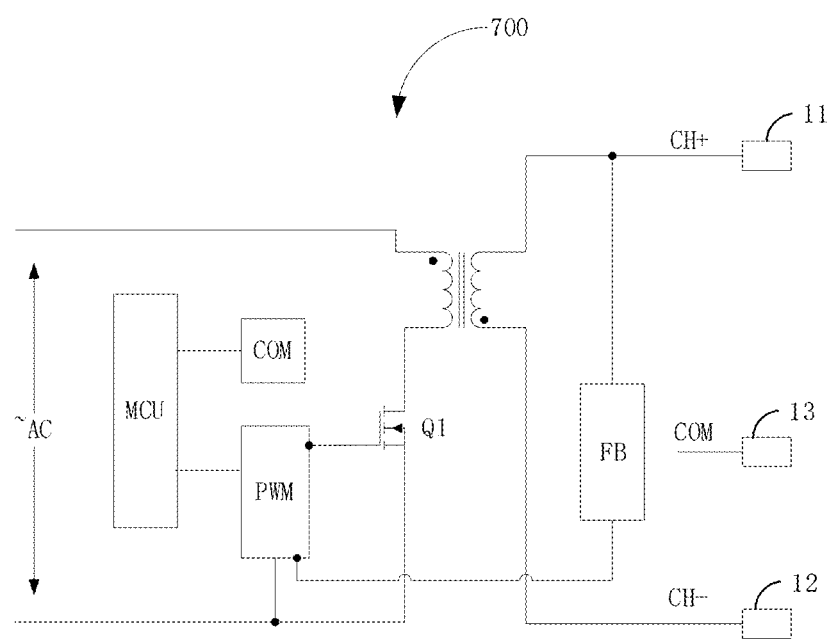
FIG. 7 shows a schematic view of an alternating current charger of an embodiment of the disclosure.

The disclosure also provides a battery pack charging system. The battery pack charging system includes a charger, the battery charging circuit shown in FIG. 1 through FIG. 5 and a battery unit 40. The battery unit 40 is connected with the charger through the battery charging circuit, and the charger includes an alternating current charger 700 as shown in FIG. 7 or a direct current charger 600 as shown in FIG. 6.

Hereinafter, the battery charging circuit of the disclosure will be described in detail with reference to the drawings.

The First Embodiment

In this embodiment, please refer to FIG. 1, a battery charging circuit 100 is suitable for direct current charging high-side control. The power supply unit 10 is powered by a voltage at a charging terminal. The battery charging circuit 100 is connected with an output terminal of a direct current charger 600 as shown in FIG. 6 through the charging terminal. The NMOS transistor Q11 is an NMOS transistor with a body diode.

Please refer to FIG. 1, the power supply unit 10 includes a boost circuit chip U1 (for example, a model may be MC34063), a resistor R11, a resistor R12, a resistor R13, a diode D11, a diode D12, an inductor L11, a capacitor C11, and a capacitor C12. An anode of the diode D11 is respectively connected with the charging positive terminal 91 and a source of the NMOS transistor Q11, a cathode of the diode D11 is connected with the charging negative terminal 92 via the capacitor C11, at the same time, the cathode of the diode D11 is respectively connected with a VCC pin of the boost circuit chip U1 and one end of the resistor R11, the other end of the resistor R11 is connected with one end of the inductor L11 and a second end of the boost circuit chip U1, the other end of the inductor L11 is respectively connected with a SW pin of the boost circuit chip U1 and an anode of the diode D12, a cathode of the diode D12 is further connected with the charging negative terminal 92 via the capacitor C12, at the same time, the cathode of the diode D12 is further respectively connected with a power source end of the switch control unit 20 and one end of the resistor R13, the other end of the resistor R13 is connected with a COM pin of the boost circuit chip U1, simultaneously, the other end of the resistor R13 is connected with the charging negative terminal 92 via the resistor R12, and a GND pin of the boost circuit chip U1 is connected with the charging negative terminal 92.

Please refer to FIG. 1, the switch control unit 20 includes an intelligent synchronous rectification control chip U2 (for example, the model may be MP6905), a resistor R21, a resistor R22, a resistor R23, a resistor R24, and a Zener diode ZD21. A VSS pin of the intelligent synchronous rectification control chip U2 is respectively connected with the source of the NMOS transistor Q11 and the charging positive terminal 91, at the same time, the VSS pin of the intelligent synchronous rectification control chip U2 is connected with one end of the resistor R21. The other end of the resistor R21 is connected with an LL pin of the intelligent synchronous rectification control chip U2. A PGND pin of the intelligent synchronous rectification control chip U2 is respectively connected to the source of the NMOS transistor Q11 and the charging positive terminal 91. A VG pin of the intelligent synchronous rectification control chip U2 is connected with a gate of the NMOS transistor Q11 via the resistor R24. A VD pin of the intelligent synchronous rectification control chip U2 is connected with a drain of the NMOS transistor Q11 via the resistor R23. An EN pin of the intelligent synchronous rectification control chip U2 is respectively connected with one end of the resistor R22 and a cathode of the Zener diode ZD21. An anode of the Zener diode ZD21 is connected with the charging negative terminal 92. The other end of the resistor R22 is respectively connected with the VCC pin of the intelligent synchronous rectification control chip U2 and the output end of the power supply unit 10.

In this embodiment, please refer to FIG. 1, the battery charging circuit 100 further includes an NMOS transistor Q12, a controller 30, a low-dropout linear regulator 60, a PMOS transistor Q13, a resistor R31, and a Zener diode ZD31. The NMOS transistor Q12 is an NMOS transistor with a body diode, which is used for secondary protection to prevent the charger from running out of control and over charging. A source of the PMOS transistor Q13 is connected with the output of the power supply unit 10. A drain of the PMOS transistor Q13 is connected with one end of the resistor R31. The other end of the resistor R31 is respectively connected with a gate of the NMOS transistor Q12 and a cathode of the Zener diode ZD31. An anode of the Zener diode ZD31 is respectively connected with a source of the NMOS transistor Q12 and a positive electrode of the battery unit 40. A drain of the NMOS transistor Q12 is connected with the drain of the NMOS transistor Q11. A gate of the PMOS transistor Q13 is connected with the controller 30. The controller 30 controls on and off of the output terminal of the power supply unit 10 and the gate of the NMOS transistor Q12 by controlling on and off of the PMOS transistor Q13, thereby controlling the on and off of the NMOS transistor Q12.

In this embodiment, please refer to FIG. 1, the battery charging circuit 100 further includes a voltage collection unit 70 and a temperature collection unit 50. The voltage collection unit 70 and the temperature collection unit 50 are connected with the controller 30. The voltage collection unit 70 is used to collect a battery voltage of the battery unit 40 and transmit it to the controller 30. The temperature collection unit 50 is used to collect a battery temperature of the battery unit 40 and transmit it to the controller 30. As an example, the temperature collection unit 50 includes, for example, a temperature sensor and a peripheral circuit. The temperature sensor may be, for example, a positive temperature coefficient sensor (abbreviated as PTC sensor) or a negative temperature coefficient sensor (abbreviated as NTC sensor).

Figure 8:
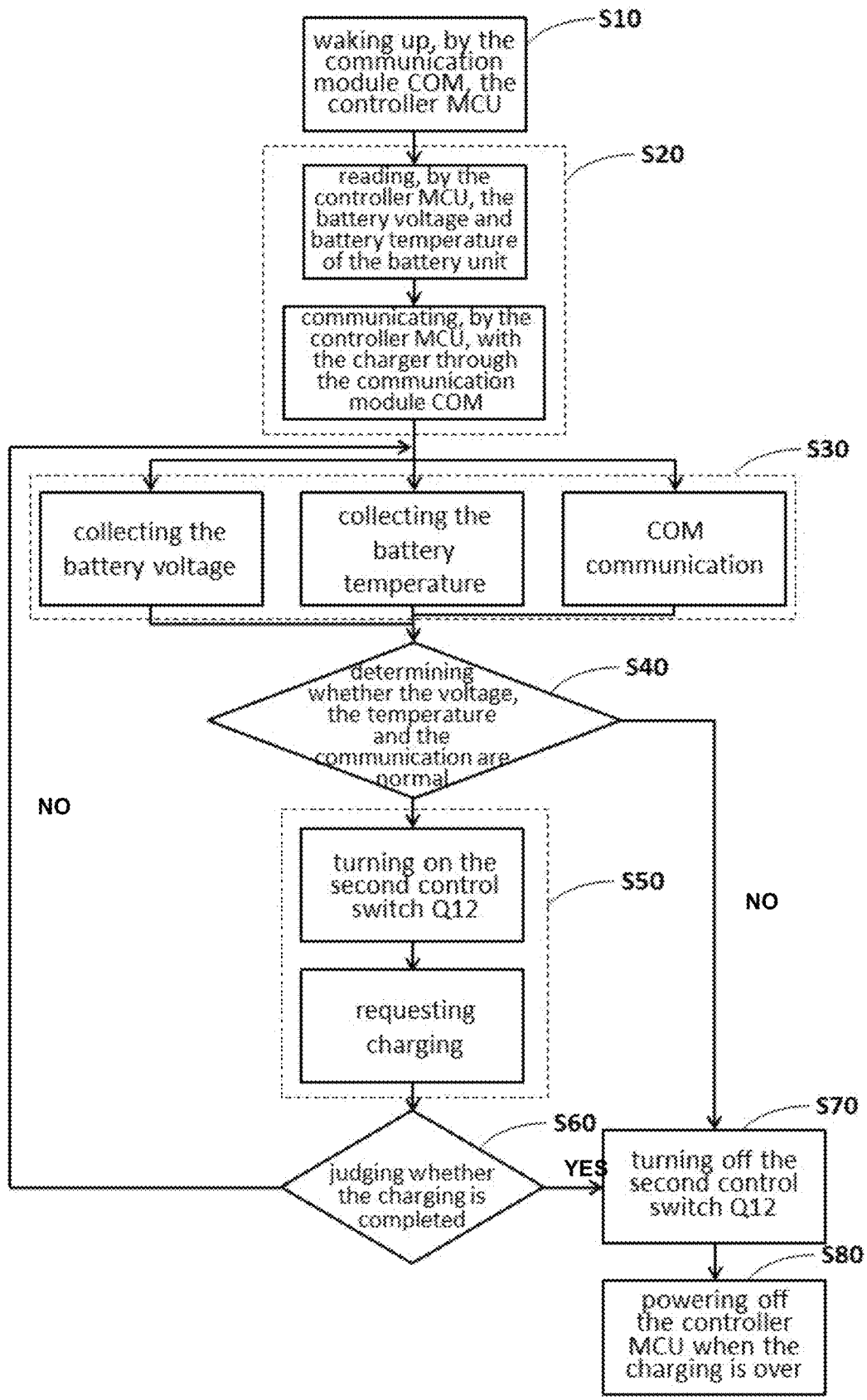
FIG. 8 shows a charging logic view of a battery pack of an embodiment of the disclosure.

Please refer to FIG. 1 and FIG. 6. When charging, a positive output terminal 11 and a negative output terminal 12 of the direct current charger 600 as shown in FIG. 6 are respectively connected with the charging positive terminal 91 and the charging negative terminal 92 of the battery charging circuit 100. A communication port 13 of the direct current charger 600 is in turn communicatively connected with the controller 30 through a communication terminal 93 of the battery charging circuit 100 and a communication module 80, thereby realizing an information interaction between the battery unit 40 and the charger. As shown in FIG. 8, a charging logic of the battery unit 40 is as follows: S10: waking up, by the communication module 80, the controller 30 when the direct current charger 600 is connected with the battery charging circuit 100; S20: reading, by the controller 30, the battery voltage and battery temperature of the battery unit 40, and communicating, by the controller 30, with the charger through the communication module 80; S30: collecting the battery voltage and battery temperature of the battery unit 40 collected by the voltage collection unit 70 and the temperature collection unit 50, and detecting communication status of the communication module 80; S40: determining whether the battery voltage of the battery unit 40, the battery temperature of the battery unit 40 and a communication of the communication module 80 are normal or not, if yes, executing S50, if not, executing S70; S50: turning on the NMOS transistor Q12 and charging; S60: judging whether the charging is completed or not during a charging process, if yes, executing S70, if not, returning to S30; S70: turning off the NMOS transistor Q12; S80: powering off the controller 30 when the charging is over.

Please refer to FIG. 1 and FIG. 6. When charging, a direct current signal is input, the NMOS transistor Q11 (NMOS transistor) is placed on a positive line (high end) of the battery unit 40. U2 (MP6905) is an intelligent synchronous rectification control chip, which controls on and off of the NMOS transistor Q11 by sampling a voltage Vsd of both ends of the NMOS transistor Q11 (a source-to-drain voltage of the NMOS transistor Q11). When the Vsd is greater than 30 mV, the NMOS transistor Q11 is turned on to charge, when the Vsd is less than 0 mV, the NMOS transistor Q11 is turned off to prevent the battery from discharging externally. At the same time, the voltage at both ends of the NMOS transistor Q11 may be maintained at 30 mV when the NMOS transistor Q11 is turned on, which is suitable for a high-current fast charging. The VG pin of the intelligent synchronous rectification control chip U2 is a driving pin of the NMOS transistor Q11, and the VCC pin of the intelligent synchronous rectification control chip U2 provides a driving voltage for the VG pin. The VD pin and VSS pin of the intelligent synchronous rectification control chip U2 are respectively voltage input pins of the source and the drain of the NMOS transistor Q11, which are used as on-off signals for controlling the NMOS transistor Q11. The EN pin of the intelligent synchronous rectification control chip U2 is an enable pin of the intelligent synchronous rectification control chip U2, which controls power on and off of the intelligent synchronous rectification control chip U2. When the EN pin is at a high level, the intelligent synchronous rectification control chip U2 is powered on to control the NMOS transistor Q11 to be turned on. When the EN pin is at a low level, the intelligent synchronous rectification control chip U2 is powered off to control the NMOS transistor Q11 to be turned off. The power source of the power supply unit 10 is provided by a voltage at the charging terminal, so that a self-consumption of the battery during storage may be reduced.

The Second Embodiment

In this embodiment, please refer to FIG. 2. A battery charging circuit 200 is suitable for an alternative current charging high-side control. A power supply unit 10 is powered by a voltage at a charging terminal. The battery charging circuit 200 is connected with an output terminal of an alternative current charger 700 as shown in FIG. 7 through the charging terminal. The NMOS transistor Q11 is an NMOS transistor with a body diode.

Please refer to FIG. 2. The power supply unit 10 includes a resistor R14, a resistor R15, an NPN triode Q14, a capacitor C13, a diode D13, and a Zener diode ZD11. A base of the NPN triode is respectively connected with a cathode of the Zener diode ZD11 and one end of the resistor R15. An anode of the Zener diode ZD11 is respectively connected with a charging positive terminal 91 and a source of the NMOS transistor Q11. The other end of the resistor R15 is respectively connected with one end of the resistor R14 and a cathode of the diode D13. An anode of the diode D13 is connected with a charging negative terminal 92. The other end of the resistor R14 is connected with a collector of the NPN triode Q14. An emitter of the NPN triode Q14 is connected with the charging positive terminal 91 and the source of the NMOS transistor Q11 via the capacitor C13, and at the same time the emitter of the NPN triode Q14 is connected with a power terminal of the switch control unit 20.

Please refer to FIG. 2. The switch control unit 20 includes an intelligent synchronous rectification control chip U2 (for example, the model may be MP6905), a resistor R21, a resistor R22, a resistor R23, a resistor R24, and a Zener diode ZD21. A VSS pin of the intelligent synchronous rectification control chip U2 is respectively connected with the source of the NMOS transistor Q11 and the charging positive terminal 91, and at the same time the VSS pin of the intelligent synchronous rectification control chip U2 is connected with one end of the resistor R21. The other end of the resistor R21 is connected with an LL pin of the intelligent synchronous rectification control chip U2. A PGND pin of the intelligent synchronous rectification control chip U2 is respectively connected with the source of the NMOS transistor Q11 and the charging positive terminal 91. A VG pin of the intelligent synchronous rectification control chip U2 is connected with a gate of the NMOS transistor Q11 via the resistor R24. A VD pin of the intelligent synchronous rectification control chip U2 is connected with a drain of the NMOS transistor Q11 via the resistor R23. An EN pin of the intelligent synchronous rectification control chip U2 is respectively connected with one end of the resistor R22 and a cathode of the Zener diode ZD21. An anode of the Zener diode ZD21 is connected with the charging negative terminal 92. The other end of the resistor R22 is respectively connected with a VCC pin of the intelligent synchronous rectification control chip U2 and an output end of the power supply unit 10.

In this embodiment, please refer to FIG. 2. The battery charging circuit 200 further includes an NMOS transistor Q12, a controller 30, a low-dropout linear regulator 60, a PMOS transistor Q13, a resistor R31, and a Zener diode ZD31. The NMOS transistor Q12 is an NMOS transistor with a body diode, which is used for secondary protection to prevent a charger from running out of control and over charging. A source of the PMOS transistor Q13 is connected with the output end of the power supply unit 10. A drain of the PMOS transistor Q13 is connected with one end of the resistor R31. The other end of the resistor R31 is respectively connected with a gate of the NMOS transistor Q12 and a cathode of the Zener diode ZD31. An anode of the Zener diode ZD31 is respectively connected with a source of the NMOS transistor Q12 and a positive electrode of the battery unit 40. A drain of the NMOS transistor Q12 is connected with a drain of the NMOS transistor Q11. A gate of the PMOS transistor Q13 is connected with the controller 30. The controller 30 controls on and off of the output terminal of the power supply unit 10 and the gate of the NMOS transistor Q12 through controlling on and off of the PMOS transistor Q13, thereby controlling on and off of the NMOS transistor Q12.

In this embodiment, please refer to FIG. 2. The battery charging circuit 200 further includes a voltage collection unit 70 and a temperature collection unit 50 connected with the controller 30. The voltage collection unit 70 is used to collect a battery voltage of the battery unit 40 and transmit it to the controller 30. The temperature collection unit 50 is used to collect a battery temperature of the battery unit 40 and transmit it to the controller 30. As an example, the temperature collection unit 50 includes, for example, a temperature sensor and a peripheral circuit. The temperature sensor may be, for example, a positive temperature coefficient sensor (abbreviated as PTC sensor) or a negative temperature coefficient sensor (abbreviated as NTC sensor).

Please refer to FIG. 2 and FIG. 7. When charging, a positive output terminal 11 and a negative output terminal 12 of the alternative current charger 700 as shown in FIG. 7 are respectively connected with the charging positive terminal 91 and the charging negative terminal 92 of the battery charging circuit 200. A communication port 13 of the alternative current charger 700 is in turn communicatively connected with the controller 30 through a communication terminal 93 of the battery charging circuit 200 and a communication module 80, so as to realize an information interaction between the battery unit 40 and the charger. Please refer to FIG. 8, a charging logic of the battery unit 40 is as follows: S10: waking up, by the communication module 80, the controller 30 when the alternative current charger 700 is connected with the battery charging circuit 200; S20: reading, by the controller 30, the battery voltage and battery temperature of the battery unit 40, and communicating, by the controller 30, with the charger through the communication module 80; S30: collecting the battery voltage and battery temperature of the battery unit 40 collected by the voltage collection unit 70 and the temperature collection unit 50, and detecting communication status of the communication module 80; S40: determining whether the battery voltage of the battery unit 40, the battery temperature of the battery unit 40 and a communication of the communication module 80 are normal or not, if yes, executing S50, if not, executing S70; S50: turning on the NMOS transistor Q12 and charging; S60: judging whether the charging is completed during a charging process, if yes, executing S70, if not, returning to S30; S70: turning off the NMOS transistor Q12; S80: powering off the controller 30 when the charging is over.

Please refer to FIG. 2 and FIG. 7. When charging, an alternative current signal is input, the NMOS transistor Q11 (NMOS transistor) is placed on a positive line (high end) of the battery unit 40. U2 (MP6905) is an intelligent synchronous rectification control chip, which controls on and off of the NMOS transistor Q11 by sampling a voltage Vsd of both ends of the NMOS transistor Q11 (a source-to-drain voltage of the NMOS transistor Q11). When the Vsd is greater than 30 mV, the NMOS transistor Q11 is turned on to charge, when the Vsd is less than 0 mV, the NMOS transistor Q11 is turned off to prevent the battery from discharging externally. At the same time, the voltage at both ends of the NMOS transistor Q11 may be maintained at 30 mV when the NMOS transistor Q11 is turned on, which is suitable for a high-current fast charging. The VG pin of the intelligent synchronous rectification control chip U2 is a driving pin of the NMOS transistor Q11, and the VCC pin of the intelligent synchronous rectification control chip U2 provides a driving voltage for the VG pin. The VD pin and VSS pin of the intelligent synchronous rectification control chip U2 are respectively voltage input pins of a source and a drain of the NMOS transistor Q11, which are used as on-off signals for controlling the NMOS transistor Q11. The EN pin of the intelligent synchronous rectification control chip U2 is an enable pin of the intelligent synchronous rectification control chip U2, which controls power on and off of the intelligent synchronous rectification control chip U2. When the EN pin is at a high level, the intelligent synchronous rectification control chip U2 is powered on to control the NMOS transistor Q11 to be turned on. When the EN pin is at a low level, the intelligent synchronous rectification control chip U2 is powered off to control the NMOS transistor Q11 to be turned off. The power source of the power supply unit 10 is provided by a voltage at the charging terminal, so that a self-consumption of the battery during storage may be reduced.

The Third Embodiment

In this embodiment, please refer to FIG. 3. A battery charging circuit 300 is suitable for a direct current charging low-side control. A power supply unit 10 is powered by a voltage at a charging terminal. The battery charging circuit 300 is connected with an output terminal of a direct current charger 600 as shown in FIG. 6 through the charging terminal. The NMOS transistor Q11 is an NMOS transistor with a body diode.

Please refer to FIG. 3. The power supply unit 10 includes a resistor R14, a resistor R15, an NPN triode Q14, a capacitor C13, a diode D13, and a Zener diode ZD11. A base of the NPN triode is respectively connected with a cathode of the Zener diode ZD11 and one end of the resistor R15. An anode of the Zener diode ZD11 is respectively connected with a charging negative terminal 92 and a drain of the NMOS transistor Q11. The other end of the resistor R15 is respectively connected with one end of the resistor R14 and a cathode of the diode D13. An anode of the diode D13 is connected with a charging positive terminal 91 and a positive electrode of the battery unit 40. The other end of the resistor R14 is connected with a collector of the NPN transistor Q14. An emitter of the NPN transistor Q14 is connected with the charging negative terminal 92 and the drain of the NMOS transistor Q11 via the capacitor C13, and at the same time an emitter of the NPN transistor Q14 is connected with a power source end of the switch control unit 20.

Please refer to FIG. 3. The switch control unit 20 includes an intelligent synchronous rectification control chip U2 (for example, the model may be MP6905), a resistor R21, a resistor R22, a resistor R23, a resistor R24, and a Zener diode ZD21. A VSS pin of the intelligent synchronous rectification control chip U2 is connected with a source of the NMOS transistor Q11 and a negative electrode of the battery unit 40 respectively, and at the same time the VSS pin of the intelligent synchronous rectification control chip U2 is connected with one end of the resistor R21. The other end of the resistor R21 is connected with an LL pin of the intelligent synchronous rectification control chip U2, a PGND pin of the intelligent synchronous rectification control chip U2 is respectively connected with the source of the NMOS transistor Q11 and the negative electrode of the battery unit 40. A VG pin of the intelligent synchronous rectification control chip U2 is connected with a gate of the NMOS transistor Q11 via the resistor R24. A VD pin of the intelligent synchronous rectification control chip U2 is connected with a drain of the NMOS transistor Q11 via the resistor R23. An EN pin of the intelligent synchronous rectification control chip U2 is respectively connected with one end of the resistor R22 and a cathode of the Zener diode ZD21. An anode of the Zener diode ZD21 is connected with the charging negative terminal 92. The other end of the resistor R22 is respectively connected with a VCC pin of the intelligent synchronous rectification control chip U2 and an output end of the power supply unit 10.

In this embodiment, please refer to FIG. 3. The battery charging circuit 300 further includes an NMOS transistor Q12, a controller 30 and a low-dropout linear regulator 60. The NMOS transistor Q12 is an NMOS transistor with a body diode, which is used for secondary protection to prevent a charger from running out of control and over charging. The controller 30 is connected with a gate of the NMOS transistor Q12. A source of the NMOS transistor Q12 is connected with the source of the NMOS transistor Q11. A drain of the NMOS transistor Q12 is connected with the negative electrode of the battery unit 40. The controller 30 is used to control on and off of the NMOS transistor Q12.

In this embodiment, please refer to FIG. 3. The battery charging circuit 300 further includes a voltage collection unit 70 and a temperature collection unit 50 connected with the controller 30. The voltage collection unit 70 is used to collect a battery voltage of the battery unit 40 and transmit it to the controller 30. The temperature collection unit 50 is used to collect a battery temperature of the battery unit 40 and transmit it to the controller 30. As an example, the temperature collection unit 50 includes, for example, a temperature sensor and a peripheral circuit. The temperature sensor may be, for example, a positive temperature coefficient sensor (abbreviated as PTC sensor) or a negative temperature coefficient sensor (abbreviated as NTC sensor).

Please refer to FIG. 3 and FIG. 6. When charging, a positive output terminal 11 and a negative output terminal 12 of the direct current charger 600 as shown in FIG. 6 are respectively connected with the charging positive terminal 91 and the charging negative terminal 92 of the battery charging circuit 300. A communication port 13 of the direct current charger 600 is in turn communicatively connected with the controller 30 through a communication terminal 93 of the battery charging circuit 300 and a communication module 80, thereby realizing an information interaction between the battery unit 40 and the charger. As shown in FIG. 8, a charging logic of the battery unit 40 is as follows: S10: waking up, by the communication module 80, the controller 30 when the direct current charger 600 is connected with the battery charging circuit 300; S20: reading, by the controller 30, the battery voltage and battery temperature of the battery unit 40, and communicating, by the controller 30, with the charger through the communication module 80; S30: collecting the battery voltage and battery temperature of the battery unit 40 collected by the voltage collection unit 70 and the temperature collection unit 50, and detecting communication status of the communication module 80; S40: determining whether the battery voltage of the battery unit 40, the battery temperature of the battery unit 40 and a communication of the communication module 80 are normal or not, if yes, executing S50, if not, executing S70; S50: turning on the NMOS transistor Q12 and charging; S60: judging whether the charging is completed or not during a charging process, if yes, executing S70, if not, returning to S30; S70: turning off the NMOS transistor Q12; S80: powering off the controller 30 when the charging is over.

Please refer to FIG. 3 and FIG. 6. When charging, a direct current signal is input, the NMOS transistor Q11 (NMOS transistor) is placed on a negative line (low end) of the battery unit 40. U2 (MP6905) is an intelligent synchronous rectification control chip, which controls on and off of the NMOS transistor Q11 by sampling a voltage Vsd of both ends of the NMOS transistor Q11 (a source-to-drain voltage of the NMOS transistor Q11). When the Vsd is greater than 30 mV, the NMOS transistor Q11 is turned on to charge, when the Vsd is less than 0 mV, the NMOS transistor Q11 is turned off to prevent the battery from discharging externally. At the same time, the voltage at both ends of the NMOS transistor Q11 may be maintained at 30 mV when the NMOS transistor Q11 is turned on, which is suitable for a high-current fast charging. The VG pin of the intelligent synchronous rectification control chip U2 is a driving pin of the NMOS transistor Q11, and the VCC pin of the intelligent synchronous rectification control chip U2 provides a driving voltage for the VG pin. The VD pin and VSS pin of the intelligent synchronous rectification control chip U2 are respectively voltage input pins of the source and the drain of the NMOS transistor Q11, which are used as on-off signals for controlling the NMOS transistor Q11. The EN pin of the intelligent synchronous rectification control chip U2 is an enable pin of the intelligent synchronous rectification control chip U2, which controls power on and off of the intelligent synchronous rectification control chip U2. When the EN pin is at a high level, the intelligent synchronous rectification control chip U2 is powered on to control the NMOS transistor Q11 to be turned on. When the EN pin is at a low level, the intelligent synchronous rectification control chip U2 is powered off to control the NMOS transistor Q11 to be turned off. The power source of the power supply unit 10 is provided by a voltage at the charging terminal, so that a self-consumption of the battery during storage may be reduced.

The Fourth Embodiment

In this embodiment, please refer to FIG. 3. A battery charging circuit 300 is suitable for an alternative current charging low-side control. A power supply unit 10 is powered by a voltage at a charging terminal. A circuit diagram of the battery charging circuit 300 in this embodiment is the same as the circuit diagram of the battery charging circuit 300 in the third embodiment. The difference is that the battery charging circuit 300 is connected with an output terminal of the alternative current charger 700 as shown in FIG. 7 through the charging terminal.

Please refer to FIG. 3 and FIG. 7. When charging, a positive output terminal 11 and a negative output terminal 12 of the alternative current charger 700 as shown in FIG. 7 are respectively connected with the charging positive terminal 91 and the charging negative terminal 92 of the battery charging circuit 300. A communication port 13 of the alternative current charger 700 is in turn communicatively connected with the controller 30 through a communication terminal 93 of the battery charging circuit 300 and a communication module 80, so as to realize an information interaction between the battery unit 40 and the charger. Please refer to FIG. 8, a charging logic of the battery unit 40 is as follows: S10: waking up, by the communication module 80, the controller 30 when the alternative current charger 700 is connected with the battery charging circuit 300; S20: reading, by the controller 30, the battery voltage and battery temperature of the battery unit 40, and communicating, by the controller 30, with the charger through the communication module 80; S30: collecting the battery voltage and battery temperature of the battery unit 40 collected by the voltage collection unit 70 and the temperature collection unit 50, and detecting communication status of the communication module 80; S40: determining whether the battery voltage of the battery unit 40, the battery temperature of the battery unit 40 and a communication of the communication module 80 are normal or not, if yes, executing S50, if not, executing S70; S50: turning on the NMOS transistor Q12 and charging; S60: judging whether the charging is completed or not during a charging process, if yes, executing S70, if not, returning to S30; S70: turning off the NMOS transistor Q12; S80: powering off the controller 30 when the charging is over.

Please refer to FIG. 3 and FIG. 7. When charging, an alternative current signal is input, the NMOS transistor Q11 (NMOS transistor) is placed on a negative line (low end) of the battery unit 40. U2 (MP6905) is an intelligent synchronous rectification control chip, which controls on and off of the NMOS transistor Q11 by sampling a voltage Vsd of both ends of the NMOS transistor Q11 (a source-to-drain voltage of the NMOS transistor Q11). When the Vsd is greater than 30 mV, the NMOS transistor Q11 is turned on to charge, when the Vsd is less than 0 mV, the NMOS transistor Q11 is turned off to prevent the battery from discharging externally. At the same time, the voltage at both ends of the NMOS transistor Q11 may be maintained at 30 mV when the NMOS transistor Q11 is turned on, which is suitable for a high-current fast charging. The VG pin of the intelligent synchronous rectification control chip U2 is a driving pin of the NMOS transistor Q11, and the VCC pin of the intelligent synchronous rectification control chip U2 provides a driving voltage for the VG pin. The VD pin and VSS pin of the intelligent synchronous rectification control chip U2 are respectively voltage input pins of the source and the drain of the NMOS transistor Q11, which are used as on-off signals for controlling the NMOS transistor Q11. The EN pin of the intelligent synchronous rectification control chip U2 is an enable pin of the intelligent synchronous rectification control chip U2, which controls power on and off of the intelligent synchronous rectification control chip U2. When the EN pin is at a high level, the intelligent synchronous rectification control chip U2 is powered on to control the NMOS transistor Q11 to be turned on. When the EN pin is at a low level, the intelligent synchronous rectification control chip U2 is powered off to control the NMOS transistor Q11 to be turned off. The power source of the power supply unit 10 is provided by a voltage at the charging terminal, so that a self-consumption of the battery during storage may be reduced.

The Fifth Embodiment

In this embodiment, please refer to FIG. 4. a battery charging circuit 400 is suitable for direct current charging high-side control. The power supply unit 10 is powered by a battery unit 40. The battery charging circuit 400 is connected with an output terminal of a direct current charger 600 as shown in FIG. 6 through the charging terminal. The NMOS transistor Q11 is an NMOS transistor with a body diode.

Please refer to FIG. 4, the power supply unit 10 includes a boost circuit chip U1 (for example, a model may be MC34063), a resistor R11, a resistor R12, a resistor R13, a diode D11, a diode D12, an inductor L11, a capacitor C11, and a capacitor C12. An anode of the diode D11 is connected with a charging positive terminal 91 of the NMOS transistor Q12. A cathode of the diode D11 is connected with a charging negative terminal 92 via the capacitor C11, and at the same time the cathode of the diode D11 is respectively connected t with a VCC pin of the boost circuit chip U1 and one end of the resistor R11. The other end of the resistor R11 is connected with one end of the inductor L11 and a second end of the boost circuit chip U1. The other end of the inductor L11 is respectively connected with a SW pin of the boost circuit chip U1 and an anode of the diode D12. A cathode of the diode D12 is further connected with the charging negative terminal 92 via the capacitor C12, and at the same time the cathode of the diode D12 is further respectively connected with a power source end of the switch control unit 20 and one end of the resistor R13. The other end of the resistor R13 is connected with a COM pin of the boost circuit chip U1, and at the same time the other end of the resistor R13 is connected with the charging negative terminal 92 via the resistor R12. A GND pin of the boost circuit chip U1 is connected with the charging negative terminal 92.

Please refer to FIG. 4, the switch control unit 20 includes an intelligent synchronous rectification control chip U2 (for example, the model may be MP6905), a resistor R21, a resistor R22, a resistor R23, a resistor R24, and a Zener diode ZD21. A VSS pin of the intelligent synchronous rectification control chip U2 is respectively connected with the source of the NMOS transistor Q11 and the charging positive terminal 91, at the same time, the VSS pin of the intelligent synchronous rectification control chip U2 is connected with one end of the resistor R21. The other end of the resistor R21 is connected with an LL pin of the intelligent synchronous rectification control chip U2. A PGND pin of the intelligent synchronous rectification control chip U2 is respectively connected to the source of the NMOS transistor Q11 and the charging positive terminal 91. A VG pin of the intelligent synchronous rectification control chip U2 is connected with a gate of the NMOS transistor Q11 via the resistor R24. A VD pin of the intelligent synchronous rectification control chip U2 is connected with a drain of the NMOS transistor Q11 via the resistor R23. An EN pin of the intelligent synchronous rectification control chip U2 is respectively connected with one end of the resistor R22 and a cathode of the Zener diode ZD21. An anode of the Zener diode ZD21 is connected with the charging negative terminal 92. The other end of the resistor R22 is respectively connected with the VCC pin of the intelligent synchronous rectification control chip U2 and the output end of the power supply unit 10.

In this embodiment, please refer to FIG. 4, the battery charging circuit 400 further includes an NMOS transistor Q12, a controller 30, a low-dropout linear regulator 60, a PMOS transistor Q13, a resistor R31, and a Zener diode ZD31. The NMOS transistor Q12 is an NMOS transistor with a body diode, which is used for secondary protection to prevent the charger from running out of control and over charging. A source of the PMOS transistor Q13 is connected with the output of the power supply unit 10. A drain of the PMOS transistor Q13 is connected with one end of the resistor R31. The other end of the resistor R31 is respectively connected with a gate of the NMOS transistor Q12 and a cathode of the Zener diode ZD31. A drain of the NMOS transistor Q12 is connected with the drain of the NMOS transistor Q11. An anode of the Zener diode ZD31 is respectively connected with a source of the NMOS transistor Q12 and a positive electrode of the battery unit 40. A gate of the PMOS transistor Q13 is connected with the controller 30. The controller 30 controls on and off of the output terminal of the power supply unit 10 and the gate of the NMOS transistor Q12 by controlling on and off of the PMOS transistor Q13, thereby controlling the on and off of the NMOS transistor Q12.

In this embodiment, please refer to FIG. 4, the battery charging circuit 400 further includes a voltage collection unit 70 and a temperature collection unit 50. The voltage collection unit 70 and the temperature collection unit 50 are connected with the controller 30. The voltage collection unit 70 is used to collect a battery voltage of the battery unit 40 and transmit it to the controller 30. The temperature collection unit 50 is used to collect a battery temperature of the battery unit 40 and transmit it to the controller 30. As an example, the temperature collection unit 50 includes, for example, a temperature sensor and a peripheral circuit. The temperature sensor may be, for example, a positive temperature coefficient sensor (abbreviated as PTC sensor) or a negative temperature coefficient sensor (abbreviated as NTC sensor).

Please refer to FIG. 4 and FIG. 6. When charging, a positive output terminal 11 and a negative output terminal 12 of the direct current charger 600 as shown in FIG. 6 are respectively connected with the charging positive terminal 91 and the charging negative terminal 92 of the battery charging circuit 400. A communication port 13 of the direct current charger 600 is in turn communicatively connected with the controller 30 through a communication terminal 93 of the battery charging circuit 400 and a communication module 80, thereby realizing an information interaction between the battery unit 40 and the charger. As shown in FIG. 8, a charging logic of the battery unit 40 is as follows: S10: waking up, by the communication module 80, the controller 30 when the direct current charger 600 is connected with the battery charging circuit 400; S20: reading, by the controller 30, the battery voltage and battery temperature of the battery unit 40, and communicating, by the controller 30, with the charger through the communication module 80; S30: collecting the battery voltage and battery temperature of the battery unit 40 collected by the voltage collection unit 70 and the temperature collection unit 50, and detecting communication status of the communication module 80; S40: determining whether the battery voltage of the battery unit 40, the battery temperature of the battery unit 40 and a communication of the communication module 80 are normal or not, if yes, executing S50, if not, executing S70; S50: turning on the NMOS transistor Q12 and charging; S60: judging whether the charging is completed during a charging process, if yes, executing S70, if not, returning to S30; S70: turning off the NMOS transistor Q12; S80: powering off the controller 30 when the charging is over.

Please refer to FIG. 4 and FIG. 6. When charging, a direct current signal is input, the NMOS transistor Q11 (NMOS transistor) is placed on a positive line (high end) of the battery unit 40. U2 (MP6905) is an intelligent synchronous rectification control chip, which controls on and off of the NMOS transistor Q11 by sampling a voltage Vsd of both ends of the NMOS transistor Q11 (a source-to-drain voltage of the NMOS transistor Q11). When the Vsd is greater than 30 mV, the NMOS transistor Q11 is turned on to charge, when the Vsd is less than 0 mV, the NMOS transistor Q11 is turned off to prevent the battery from discharging externally. At the same time, the voltage at both ends of the NMOS transistor Q11 may be maintained at 30 mV when the NMOS transistor Q11 is turned on, which is suitable for a high-current fast charging. The VG pin of the intelligent synchronous rectification control chip U2 is a driving pin of the NMOS transistor Q11, and the VCC pin of the intelligent synchronous rectification control chip U2 provides a driving voltage for the VG pin. The VD pin and VSS pin of the intelligent synchronous rectification control chip U2 are respectively voltage input pins of the source and the drain of the NMOS transistor Q11, which are used as on-off signals for controlling the NMOS transistor Q11. The EN pin of the intelligent synchronous rectification control chip U2 is an enable pin of the intelligent synchronous rectification control chip U2, which controls power on and off of the intelligent synchronous rectification control chip U2. When the EN pin is at a high level, the intelligent synchronous rectification control chip U2 is powered on to control the NMOS transistor Q11 to be turned on. When the EN pin is at a low level, the intelligent synchronous rectification control chip U2 is powered off to control the NMOS transistor Q11 to be turned off. Since a power source of the power supply unit 10 is provided by the battery unit 40, the boost circuit chip U1 and the intelligent synchronous rectification control chip U2 are always in a wake-up working state.

The Sixth Embodiment

In this embodiment, please refer to FIG. 4. A battery charging circuit 400 is suitable for an alternative current charging high-side control. A power supply unit 10 is powered by a battery unit 40. A circuit diagram of the battery charging circuit 400 in this embodiment is the same as the circuit diagram of the battery charging circuit 400 in the fifth embodiment. The difference is that the battery charging circuit 400 is connected with an output terminal of the alternative current charger 700 as shown in FIG. 7 through a charging terminal.

Please refer to FIG. 4 and FIG. 7. When charging, a positive output terminal 11 and a negative output terminal 12 of the alternative current charger 700 as shown in FIG. 7 are respectively connected with the charging positive terminal 91 and the charging negative terminal 92 of the battery charging circuit 400. A communication port 13 of the alternative current charger 700 is in turn communicatively connected with the controller 30 through a communication terminal 93 of the battery charging circuit 400 and a communication module 80, so as to realize an information interaction between the battery unit 40 and the charger. Please refer to FIG. 8, a charging logic of the battery unit 40 is as follows: S10: waking up, by the communication module 80, the controller 30 when the alternative current charger 700 is connected with the battery charging circuit 400; S20: reading, by the controller 30, the battery voltage and battery temperature of the battery unit 40, and communicating, by the controller 30, with the charger through the communication module 80; S30: collecting the battery voltage and battery temperature of the battery unit 40 collected by the voltage collection unit 70 and the temperature collection unit 50, and detecting communication status of the communication module 80; S40: determining whether the battery voltage of the battery unit 40, the battery temperature of the battery unit 40 and a communication of the communication module 80 are normal or not, if yes, executing S50, if not, executing S70; S50: turning on the NMOS transistor Q12 and charging it; S60: judging whether the charging is completed or not during a charging process, if yes, executing S70, if not, returning to S30; S70: turning off the NMOS transistor Q12; S80: powering off the controller 30 when the charging is over.

Please refer to FIG. 4 and FIG. 7. When charging, an alternative current signal is input, the NMOS transistor Q11 (NMOS transistor) is placed on a positive line (high end) of the battery unit 40. U2 (MP6905) is an intelligent synchronous rectification control chip, which controls on and off of the NMOS transistor Q11 by sampling a voltage Vsd of both ends of the NMOS transistor Q11 (a source-to-drain voltage of the NMOS transistor Q11). When the Vsd is greater than 30 mV, the NMOS transistor Q11 is turned on to charge, when the Vsd is less than 0 mV, the NMOS transistor Q11 is turned off to prevent the battery from discharging externally. At the same time, the voltage at both ends of the NMOS transistor Q11 may be maintained at 30 mV when the NMOS transistor Q11 is turned on, which is suitable for a high-current fast charging. The VG pin of the intelligent synchronous rectification control chip U2 is a driving pin of the NMOS transistor Q11, and the VCC pin of the intelligent synchronous rectification control chip U2 provides a driving voltage for the VG pin. The VD pin and VSS pin of the intelligent synchronous rectification control chip U2 are respectively voltage input pins of the source and the drain of the NMOS transistor Q11, which are used as on-off signals for controlling the NMOS transistor Q11. The EN pin of the intelligent synchronous rectification control chip U2 is an enable pin of the intelligent synchronous rectification control chip U2, which controls power on and off of the intelligent synchronous rectification control chip U2. When the EN pin is at a high level, the intelligent synchronous rectification control chip U2 is powered on to control the NMOS transistor Q11 to be turned on. When the EN pin is at a low level, the intelligent synchronous rectification control chip U2 is powered off to control the NMOS transistor Q11 to be turned off. Since a power source of the power supply unit 10 is provided by the battery unit 40, the boost circuit chip U1 and the intelligent synchronous rectification control chip U2 are always in a wake-up working state.

The Seventh Embodiment

In this embodiment, please refer to FIG. 5. A battery charging circuit 500 is suitable for a direct current charging low-side control. A power supply unit 10 is powered by a battery unit 40. The battery charging circuit 500 is connected with an output terminal of a direct current charger 600 as shown in FIG. 6 through a charging terminal. The NMOS transistor Q11 is an NMOS transistor with a body diode.

Please refer to FIG. 5. The power supply unit 10 includes a resistor R14, a resistor R15, an NPN triode Q14, a capacitor C13, a diode D13, and a Zener diode ZD11. A base of the NPN triode is respectively connected with a cathode of the Zener diode ZD11 and one end of the resistor R15. An anode of the Zener diode ZD11 is respectively connected with a negative electrode of the battery unit 40 and a source of the NMOS transistor Q11. The other end of the resistor R15 is respectively connected with one end of the resistor R14 and a cathode of the diode D13. An anode of the diode D13 is connected with a positive electrode of the battery unit 40 and a charging positive terminal 91. The other end of the resistor R14 is connected with a collector of the NPN transistor Q14. An emitter of the NPN transistor Q14 is connected with the negative electrode of the battery unit 40 and the source of the NMOS transistor Q11 via the capacitor C13, and at the same time the emitter of the NPN transistor Q14 is connected with a power source end of the switch control unit 20.

Please refer to FIG. 5. The switch control unit 20 includes an intelligent synchronous rectification control chip U2 (for example, the model may be MP6905), a resistor R21, a resistor R22, a resistor R23, a resistor R24, and a Zener diode ZD21. A VSS pin of the intelligent synchronous rectification control chip U2 is connected with a source of the NMOS transistor Q11 and a negative electrode of the battery unit 40, and at the same time the VSS pin of the intelligent synchronous rectification control chip U2 is connected with one end of the resistor R21. The other end of the resistor R21 is connected with an LL pin of the intelligent synchronous rectification control chip U2, a PGND pin of the intelligent synchronous rectification control chip U2 is respectively connected with the source of the NMOS transistor Q11 and the negative electrode of the battery unit 40. A VG pin of the intelligent synchronous rectification control chip U2 is connected with a gate of the NMOS transistor Q11 via the resistor R24. A VD pin of the intelligent synchronous rectification control chip U2 is connected with a drain of the NMOS transistor Q11 via the resistor R23. An EN pin of the intelligent synchronous rectification control chip U2 is respectively connected with one end of the resistor R22 and a cathode of the Zener diode ZD21. An anode of the Zener diode ZD21 is connected with the charging negative terminal 92. The other end of the resistor R22 is respectively connected with a VCC pin of the intelligent synchronous rectification control chip U2 and an output end of the power supply unit 10.

In this embodiment, please refer to FIG. 5. The battery charging circuit 500 further includes an NMOS transistor Q12, a controller 30 and a low-dropout linear regulator 60. The NMOS transistor Q12 is an NMOS transistor with a body diode, which is used for secondary protection to prevent a charger from running out of control and over charging. The controller 30 is connected with a gate of the NMOS transistor Q12. A source of the NMOS transistor Q12 is connected with the source of the NMOS transistor Q11. A drain of the NMOS transistor Q12 is connected with the negative electrode of the battery unit 40. The controller 30 is used to control on and off of the NMOS transistor Q12.

In this embodiment, please refer to FIG. 5. The battery charging circuit 500 further includes a voltage collection unit 70 and a temperature collection unit 50 connected with the controller 30. The voltage collection unit 70 is used to collect a battery voltage of the battery unit 40 and transmit it to the controller 30. The temperature collection unit 50 is used to collect a battery temperature of the battery unit 40 and transmit it to the controller 30. As an example, the temperature collection unit 50 includes, for example, a temperature sensor and a peripheral circuit. The temperature sensor may be, for example, a positive temperature coefficient sensor (abbreviated as PTC sensor) or a negative temperature coefficient sensor (abbreviated as NTC sensor).

Please refer to FIG. 5 and FIG. 6. When charging, a positive output terminal 11 and a negative output terminal 12 of the direct current charger 600 as shown in FIG. 6 are respectively connected with the charging positive terminal 91 and the charging negative terminal 92 of the battery charging circuit 500. A communication port 13 of the direct current charger 600 is in turn communicatively connected with the controller 30 through a communication terminal 93 of the battery charging circuit 500 and a communication module 80, thereby realizing an information interaction between the battery unit 40 and the charger. As shown in FIG. 8, a charging logic of the battery unit 40 is as follows: S10: waking up, by the communication module 80, the controller 30 when the direct current charger 600 is connected with the battery charging circuit 500; S20: reading, by the controller 30, the battery voltage and battery temperature of the battery unit 40, and communicating, by the controller 30, with the charger through the communication module 80; S30: collecting the battery voltage and battery temperature of the battery unit 40 collected by the voltage collection unit 70 and the temperature collection unit 50, and detecting communication status of the communication module 80; S40: determining whether the battery voltage of the battery unit 40, the battery temperature of the battery unit 40 and a communication of the communication module 80 are normal or not, if yes, executing S50, if not, executing S70; S50: turning on the NMOS transistor Q12 and charging it; S60: judging whether the charging is completed or not during a charging process, if yes, executing S70, if not, returning to S30; S70: turning off the NMOS transistor Q12; S80: powering off the controller 30 when the charging is over.

Please refer to FIG. 5 and FIG. 6. When charging, a direct current signal is input, the NMOS transistor Q11 (NMOS transistor) is placed on a negative line (low end) of the battery unit 40. U2 (MP6905) is an intelligent synchronous rectification control chip, which controls on and off of the NMOS transistor Q11 by sampling a voltage Vsd of both ends of the NMOS transistor Q11 (a source-to-drain voltage of the NMOS transistor Q11). When the Vsd is greater than 30 mV, the NMOS transistor Q11 is turned on to charge, when the Vsd is less than 0 mV, the NMOS transistor Q11 is turned off to prevent the battery from discharging externally. At the same time, the voltage at both ends of the NMOS transistor Q11 may be maintained at 30 mV when the NMOS transistor Q11 is turned on, which is suitable for a high-current fast charging. The VG pin of the intelligent synchronous rectification control chip U2 is a driving pin of the NMOS transistor Q11, and the VCC pin of the intelligent synchronous rectification control chip U2 provides a driving voltage for the VG pin. The VD pin and VSS pin of the intelligent synchronous rectification control chip U2 are respectively voltage input pins of the source and the drain of the NMOS transistor Q11, which are used as on-off signals for controlling the NMOS transistor Q11. The EN pin of the intelligent synchronous rectification control chip U2 is an enable pin of the intelligent synchronous rectification control chip U2, which controls power on and off of the intelligent synchronous rectification control chip U2. When the EN pin is at a high level, the intelligent synchronous rectification control chip U2 is powered on to control the NMOS transistor Q11 to be turned on. When the EN pin is at a low level, the intelligent synchronous rectification control chip U2 is powered off to control the NMOS transistor Q11 to be turned off. Since a power source of the power supply unit 10 is provided by the battery unit 40, the boost circuit chip U1 and the intelligent synchronous rectification control chip U2 are always in a wake-up working state.

The Eighth Embodiment

In this embodiment, please refer to FIG. 5. A battery charging circuit 500 is suitable for an alternative current charging low-side control. A power supply unit 10 is powered by a battery unit 40. A circuit diagram of the battery charging circuit 500 in this embodiment is the same as the circuit diagram of the battery charging circuit 500 in the seventh embodiment. The difference is that the battery charging circuit 500 is connected with an output terminal of the alternative current charger 700 as shown in FIG. 7 through a charging terminal.

Please refer to FIG. 5 and FIG. 7. When charging, a positive output terminal 11 and a negative output terminal 12 of the alternative current charger 700 as shown in FIG. 7 are respectively connected with the charging positive terminal 91 and the charging negative terminal 92 of the battery charging circuit 500. A communication port 13 of the alternative current charger 700 is in turn communicatively connected with the controller 30 through a communication terminal 93 of the battery charging circuit 500 and a communication module 80, so as to realize an information interaction between the battery unit 40 and the charger. Please refer to FIG. 8, a charging logic of the battery unit 40 is as follows: S10: waking up, by the communication module 80, the controller 30 when the alternative current charger 700 is connected with the battery charging circuit 500; S20: reading, by the controller 30, the battery voltage and battery temperature of the battery unit 40, and communicating, by the controller 30, with the charger through the communication module 80; S30: collecting the battery voltage and battery temperature of the battery unit 40 collected by the voltage collection unit 70 and the temperature collection unit 50, and detecting communication status of the communication module 80; S40: determining whether the battery voltage of the battery unit 40, the battery temperature of the battery unit 40 and a communication of the communication module 80 are normal or not, if yes, executing S50, if not, executing S70; S50: turning on the NMOS transistor Q12 and charging; S60: judging whether the charging is completed or not during a charging process, if yes, executing S70, if not, returning to S30; S70: turning off the NMOS transistor Q12; S80: powering off the controller 30 when the charging is over.

Please refer to FIG. 4 and FIG. 7. When charging, an alternative current signal is input, the NMOS transistor Q11 (NMOS transistor) is placed on a negative line (low end) of the battery unit 40. U2 (MP6905) is an intelligent synchronous rectification control chip, which controls on and off of the NMOS transistor Q11 by sampling a voltage Vsd of both ends of the NMOS transistor Q11 (a source-to-drain voltage of the NMOS transistor Q11). When the Vsd is greater than 30 mV, the NMOS transistor Q11 is turned on to charge, when the Vsd is less than 0 mV, the NMOS transistor Q11 is turned off to prevent the battery from discharging externally. At the same time, the voltage at both ends of the NMOS transistor Q11 may be maintained at 30 mV when the NMOS transistor Q11 is turned on, which is suitable for a high-current fast charging. The VG pin of the intelligent synchronous rectification control chip U2 is a driving pin of the NMOS transistor Q11, and the VCC pin of the intelligent synchronous rectification control chip U2 provides a driving voltage for the VG pin. The VD pin and VSS pin of the intelligent synchronous rectification control chip U2 are respectively voltage input pins of the source and the drain of the NMOS transistor Q11, which are used as on-off signals for controlling the NMOS transistor Q11. The EN pin of the intelligent synchronous rectification control chip U2 is an enable pin of the intelligent synchronous rectification control chip U2, which controls power on and off of the intelligent synchronous rectification control chip U2. When the EN pin is at a high level, the intelligent synchronous rectification control chip U2 is powered on to control the NMOS transistor Q11 to be turned on. When the EN pin is at a low level, the intelligent synchronous rectification control chip U2 is powered off to control the NMOS transistor Q11 to be turned off. Since a power source of the power supply unit 10 is provided by the battery unit 40, the boost circuit chip U1 and the intelligent synchronous rectification control chip U2 are always in a wake-up working state.

The Ninth Embodiment

Figure 9:
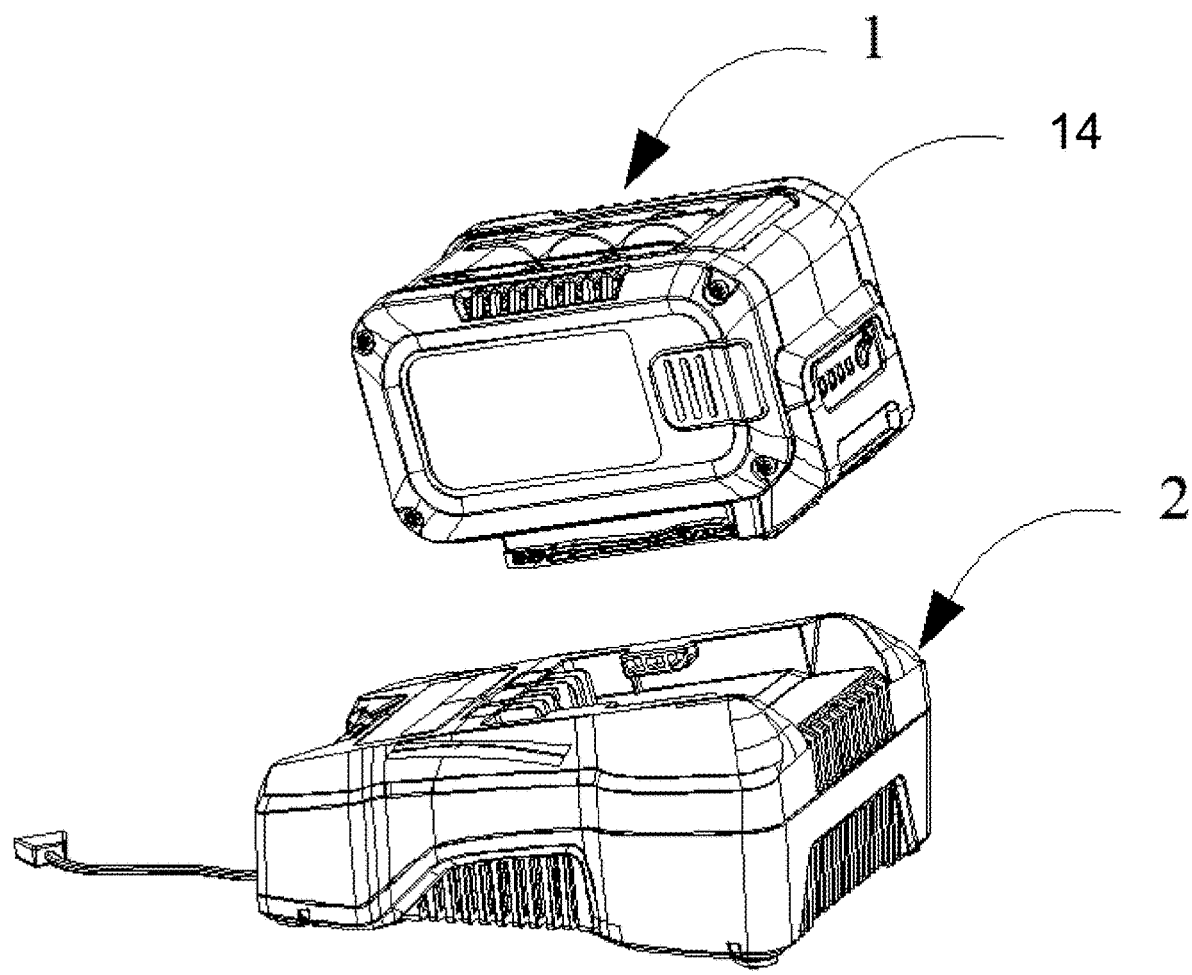
FIG. 9 shows an exploded schematic view of the battery pack and the charger of an embodiment of the disclosure.

This embodiment introduces a battery pack charging system including a battery pack and a charger. FIG. 9 shows an exploded schematic view of the battery pack and the charger. The battery pack charging system includes a charger 2 and a battery pack 1 that match each other, and the battery pack is inserted into the charger for charging.

Please refer to FIG. 9, the battery pack 1 includes a housing 14, a battery unit 40 (not shown in FIG. 9) and a battery charging circuit (not shown in FIG. 9). The housing 14 is provided with a housing cavity for housing the battery unit 40 and the battery charging circuit. The battery charging circuit is used to connect the battery unit 40 with the charger 2 to realize a charging of the battery unit 40. The battery unit 40 may also be called a battery pack, a battery module or a battery string, which includes several battery cells (also called cells). The battery charging circuit may adopt one of the battery charging circuits described in the first to eighth embodiments or combinations thereof.

Please refer to FIG. 9. The charger 2 may be, for example, an alternative current charger 700 as shown in FIG. 7 or a direct current charger 600 as shown in FIG. 6. It can be understood that the charger 2 may also be an integrated alternative current and direct current charger.

In summary, the battery charging circuit, the battery pack and the battery pack charging system of the disclosure control on-off of the charging circuit through the high-side driving or low-side driving NMOS transistors. Compared with the control of conventional PMOS transistor, the embodiments have the characteristics of low cost, strong overcurrent capability, low heat generation, high charging efficiency and prevention of discharge from the charging port. With the battery charging circuit system and the battery pack charging system of the disclosure, since an on-channel resistance of the NMOS transistor is smaller than that of the PMOS transistor, the NMOS transistor has low power consumption and low heat generation when it is turned on, and the cooling device may not be provided. The battery charging circuit system and the battery pack charging system of the disclosure may be applied to direct current charging and alternative current charging. With the battery charging circuit system and the battery pack charging system of the disclosure, a switching response time of the NMOS transistor is as low as 200 ns.

In the description herein, many specific details are provided, such as examples of components and/or methods, to provide a complete understanding of the embodiments of the disclosure. However, those skilled in the art will recognize that the embodiments of the disclosure may be realized without one or more specific details or through other devices, systems, assemblies, methods, components, materials, parts, etc. In other cases, well-known structures, materials, or operations are not specifically shown or described in detail to avoid obscuring aspects of the embodiments of the disclosure.

It should also be understood that one or more of the components shown in the drawings may also be implemented in a more separate or integrated manner, or may even be removed because it cannot be operated in some cases or may be provided because it is useful according to a particular application.

In addition, unless expressly indicated otherwise, any marking arrows in the drawings should be regarded only as exemplary instead of limiting. What's more, unless specified otherwise, the term "or" as used herein generally means "and/or." In cases where the term is foreseen because it is unclear to provide separation or combination capabilities, the combination of components or operations will also be regarded as specified.

The above description of the illustrated embodiment of the disclosure (including content described in the abstract of the specification) is not intended to exhaustively enumerate or limit the disclosure to the precise form provided herein. Although specific embodiments of the disclosure and examples of the disclosure are described herein for illustrative purposes only, as those skilled in the art recognize and understand, various equivalent modifications are possible within the scope of the disclosure. As pointed out, these modifications may be made to the disclosure according to the above description of the embodiments of the disclosure, and these modifications will be within the scope of the disclosure.

This specification has generally described the system and method which are helpful in understanding the details of the disclosure. In addition, various specific details have been given to provide an overall understanding of the embodiments of the disclosure. However, those skilled in the relevant art will recognize that the embodiments of the disclosure may be realized without one or more specific details, or may be implemented through using other devices, systems, accessories, methods, assemblies, materials, parts, etc. In other cases, well-known structures, materials, and/or operations are not specifically shown or described in detail to avoid confusion in various aspects of the embodiments of the disclosure.

Therefore, although the disclosure has been described herein with reference to its specific embodiments, a freedom of modification, various changes and substitutions are also included in the above disclosure. And it should be understood that in some cases, without departing from the scope of the disclosure, some features of the disclosure will be adopted under the conditions without corresponding use of other features. Therefore, many modifications may be made to enable a specific environment or material to adapt the essential scope of the disclosure. The disclosure is not intended to limit the specific terms used in the claims and/or specific embodiments disclosed as the best embodiment for carrying out the disclosure, but the disclosure will include any and all embodiments and equivalents falling within the scope of the appended claims. Therefore, the scope of the disclosure will only be determined by the appended claims.

What is claimed is:

1. A battery charging circuit, comprising:
   a first control switch, being an NMOS transistor (Q11) with a body diode, a source of the first control switch being connected with a charging positive terminal and a drain of the first control switch being connected with a positive electrode of a battery unit,
   a switch control unit, being connected with a gate, the source, and the drain of the first control switch and controlling on-off of the first control switch by sampling a voltage between the source and the drain of the first control switch,
   a power supply unit, connected with a power source end of the switch control unit and configured to supply power to the switch control unit;
   a second control switch, being an NMOS transistor (Q12) with a body diode, a drain of the second control switch being connected with the drain of the first control switch and a source of the second control switch being connected with the positive electrode of the battery unit,
   a controller, configured to control on-off of the second control switch, and
   a voltage regulator, a power supply end of the controller being connected with the positive electrode of the battery unit through the voltage regulator.

2. The battery charging circuit according to claim 1, further comprising a PMOS transistor (Q13), a resistor (R31) and a Zener diode (ZD31), wherein
   a source of the PMOS transistor (Q13) is connected with an output end of the power supply unit, a drain of the PMOS transistor (Q13) is connected with one end of the resistor (R31), the other end of the resistor R31 (R31) is respectively connected with a gate of the NMOS transistor (Q12) and a cathode of the Zener diode (ZD31), an anode of the Zener diode (ZD31) is respectively connected with a source of the NMOS transistor (Q12) and the positive electrode of the battery unit, and a gate of the PMOS transistor (Q13) is connected with the controller.

3. The battery charging circuit according to claim 1, further comprising a voltage collection unit, wherein
   the voltage collection unit is connected to the controller, and configured to collect a battery voltage of the battery unit and transmit the battery voltage to the controller.

4. The battery charging circuit according to claim 1, further comprising a temperature collection unit, wherein the temperature collection unit is connected to the controller, and configured to collect a battery temperature of the battery unit and transmit the battery temperature to the controller.

5. The battery charging circuit according to claim 1, wherein
a power source of the power supply unit is provided by a voltage at a charging terminal or by the battery unit.

6. The battery charging circuit according to claim 1, wherein
the switch control unit comprises an intelligent synchronous rectification control chip (U2), a resistor (R21), a resistor (R22), a resistor (R23), a resistor R24), and a Zener diode (ZD21); a first end of the intelligent synchronous rectification control chip (U2) is respectively connected with a source of the NMOS transistor (Q11) and the charging positive terminal, simultaneously the first end of the intelligent synchronous rectification control chip (U2) is connected with one end of the resistor (R21), the other end of the resistor (R21) is connected with a second end of the intelligent synchronous rectification control chip (U2), a third end of the intelligent synchronous rectification control chip (U2) is respectively connected with the source of the NMOS transistor (Q11) and the charging positive terminal, a fourth end of the intelligent synchronous rectification control chip (U2) is connected with a gate of the NMOS transistor (Q11) through the resistor (R24), a fifth end of the intelligent synchronous rectification control chip (U2) is connected with a drain of the NMOS transistor (Q11) through the resistor (R23), a sixth end of the intelligent synchronous rectification control chip (U2) is respectively connected with one end of the resistor (R22) and a cathode of the Zener diode (ZD21), an anode of the Zener diode (ZD21) is connected with a charging negative terminal, and the other end of the resistor (R22) is respectively connected with a seventh end of the intelligent synchronous rectification control chip (U2) and an output end of the power supply unit.

7. A battery pack, comprising:
a housing with a housing cavity,
a battery unit, mounted in the housing cavity, and
the battery charging circuit according to claim 1, mounted in the housing cavity and connected to the battery unit.

8. A battery pack charging system, comprising:
the battery pack according to claim 7, and
a charger, matched with the battery pack, wherein
the charger comprises an alternating current charger, a direct current charger, or an alternating current and direct current charger.

9. A battery charging circuit, comprising:
a first control switch, a source of the first control switch being connected with a negative electrode of the battery unit, a drain of the first control switch being connected with a charging negative terminal, and the first control switch being an NMOS transistor with a body diode,
a switch control unit, being respectively connected with a gate, the source, and the drain of the first control switch, the switch control unit controlling on-off of the first control switch by sampling a voltage between the source and the drain of the first control switch,
a power supply unit, an output end of the power supply unit being connected with a power source end of the switch control unit and being configured to supply power to the switch control unit;
a second control switch, being an NMOS transistor with a body diode, a source of the second control switch being connected with the source of the first control switch and a drain of the second control switch being connected with the negative electrode of the battery unit,
a controller, connected with a gate of the second control switch and configured to control on-off of the second control switch, and
a voltage regulator, a power supply end of the controller is connected with a positive electrode of the battery unit through the voltage regulator.

10. The battery charging circuit according to claim 9, further comprising a voltage collection unit, wherein
the voltage collection unit is connected with the controller, and configured to collect a battery voltage of the battery unit and transmits the battery voltage to the controller.

11. The battery charging circuit according to claim 9, further comprising a temperature collection unit, wherein
the temperature collection unit is connected with the controller and the temperature collection unit is configured to collect a battery temperature of the battery unit and transmit the battery temperature to the controller.

12. The battery charging circuit according to claim 9, wherein
a power source of the power supply unit is provided by a voltage at the charging terminal or by the battery unit.

13. The battery charging circuit according to claim 9, wherein
the switch control unit comprises an intelligent synchronous rectification control chip (U2), a resistor (R21), a resistor (R22), a resistor (R23), a resistor (R24), and a Zener diode (ZD21); a first end of the intelligent synchronous rectification control chip (U2) is respectively connected with a source of the NMOS transistor (Q11) and the negative electrode of the battery unit, simultaneously the first end of the intelligent synchronous rectification control chip (U2) is connected with one end of the resistor (R21), the other end of the resistor (R21) is connected with a second end of the intelligent synchronous rectification control chip (U2), a third end of the intelligent synchronous rectification control chip (U2) is respectively connected with the source of the NMOS transistor (Q11) and the negative electrode of the battery unit, a fourth end of the intelligent synchronous rectification control chip (U2) is connected with a gate of the NMOS transistor (Q11) through the resistor (R24), a fifth end of the intelligent synchronous rectification control chip (U2) is connected with a drain of the NMOS transistor (Q11) through the resistor (R23), a sixth end of the intelligent synchronous rectification control chip (U2) is respectively connected with one end of the resistor (R22) and a cathode of the Zener diode (ZD21), an anode of the Zener diode (ZD21) is connected with the charging negative terminal, and the other end of the resistor (R22) is respectively connected with a seventh end of the intelligent synchronous rectification control chip (U2) and an output end of the power supply unit.

\* \* \* \* \*